United States Patent
Sandström

(10) Patent No.: US 7,158,280 B2
(45) Date of Patent: Jan. 2, 2007

(54) METHODS AND SYSTEMS FOR IMPROVED BOUNDARY CONTRAST

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 11/272,925

(22) Filed: Nov. 14, 2005

(65) Prior Publication Data

US 2006/0077506 A1 Apr. 13, 2006

Related U.S. Application Data

(60) Division of application No. 10/462,010, filed on Jun. 12, 2003, and a continuation-in-part of application No. PCT/EP03/04283, filed on Apr. 24, 2003, and a continuation-in-part of application No. PCT/SE02/02310, filed on Dec. 11, 2002.

(60) Provisional application No. 60/455,364, filed on Mar. 17, 2003, provisional application No. 60/444,417, filed on Feb. 3, 2003, provisional application No. 60/415,509, filed on Oct. 1, 2002.

(30) Foreign Application Priority Data

Dec. 14, 2001 (SE) .................... 0104238

(51) Int. Cl.
*G02B 26/00* (2006.01)
*G02B 26/08* (2006.01)
*G02B 6/42* (2006.01)
*G01B 11/26* (2006.01)
*G01B 11/14* (2006.01)

(52) U.S. Cl. ........................ 359/290; 359/225; 385/18; 356/138; 356/614

(58) Field of Classification Search ................ 359/225, 359/290, 292, 298, 318; 385/18; 356/138, 356/614
See application file for complete search history.

(56) References Cited

U.S. PATENT DOCUMENTS

| 4,476,465 A | 10/1984 | Anderson |
| 4,879,605 A | 11/1989 | Warkentin et al. |
| 4,908,780 A | 3/1990 | Priem et al. |
| 5,042,950 A | 8/1991 | Salmon, Jr. |
| 5,103,101 A | 4/1992 | Berglund et al. |
| 5,123,085 A | 6/1992 | Wells et al. |
| 5,278,949 A | 1/1994 | Thayer |

(Continued)

FOREIGN PATENT DOCUMENTS

EP 0 344 952 12/1989

(Continued)

OTHER PUBLICATIONS

Larry J. Hornbeck, "From Cathode Rays to Digital Micromirrors: A History of Electronic Projection Display Technology," Digital Light Processing - Introduction TI Technical Journal Jul.-Sep. 1998, pp. 7-46.

*Primary Examiner*—Ricky Mack
*Assistant Examiner*—William Choi
(74) *Attorney, Agent, or Firm*—Ernest J. Beffel, Jr.; Haynes Beffel & Wolfeld LLP

(57) ABSTRACT

The present invention relates to methods and systems that define feature boundaries in a radiation sensitive medium on a workpiece using a diffraction-type micromirror array, extending to production of patterns and structures on a semiconductor substrate. Workpieces include lithographic masks, integrated circuits and other electronic and optical devices. Particular aspects of the present invention are described in the claims, specification and drawings.

15 Claims, 14 Drawing Sheets

U.S. PATENT DOCUMENTS

| | | |
|---|---|---|
| 5,323,002 A | 6/1994 | Sampsell et al. |
| 5,495,279 A | 2/1996 | Sandstrom |
| 5,504,504 A | 4/1996 | Markandey et al. |
| 5,533,170 A | 7/1996 | Teitzel et al. |
| 5,594,854 A | 1/1997 | Baldwin et al. |
| 5,673,376 A | 9/1997 | Ray et al. |
| 5,684,510 A | 11/1997 | Brassell et al. |
| 5,872,902 A | 2/1999 | Kuchkuda et al. |
| 6,072,500 A | 6/2000 | Foran et al. |
| 6,169,282 B1 | 1/2001 | Maeda et al. |
| 6,188,427 B1 | 2/2001 | Anderson et al. |
| 6,201,545 B1 | 3/2001 | Wong et al. |
| 6,261,728 B1 | 7/2001 | Lin |
| 6,356,340 B1 | 3/2002 | Spence |
| 6,399,261 B1 | 6/2002 | Sandstrom |
| 6,428,940 B1 | 8/2002 | Sandstrom |
| 6,618,185 B1 | 9/2003 | Sandstrom |
| 6,823,101 B1 * | 11/2004 | Gates, II et al. .............. 385/19 |

FOREIGN PATENT DOCUMENTS

| | | |
|---|---|---|
| EP | 0 814 431 | 12/1997 |
| EP | 0 851 387 | 7/1998 |
| WO | WO 00-49577 | 8/2000 |

* cited by examiner

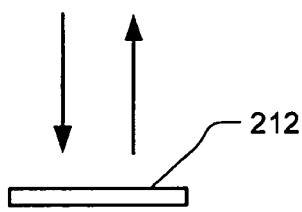
Figure 2A
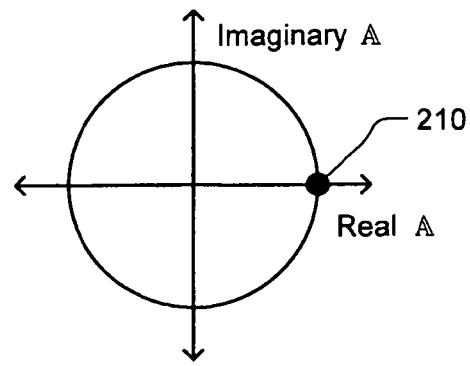
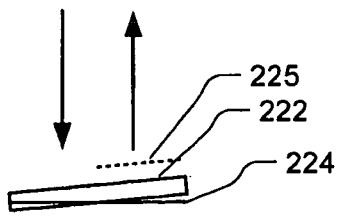
Figure 2B
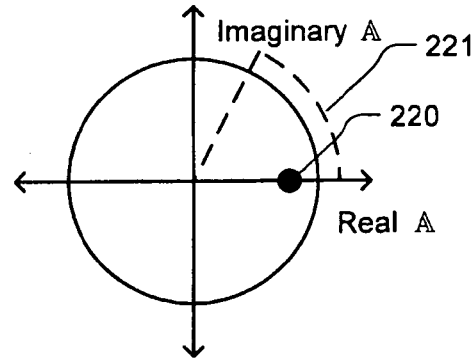
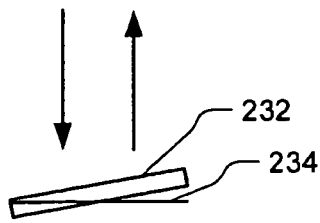
Figure 2C
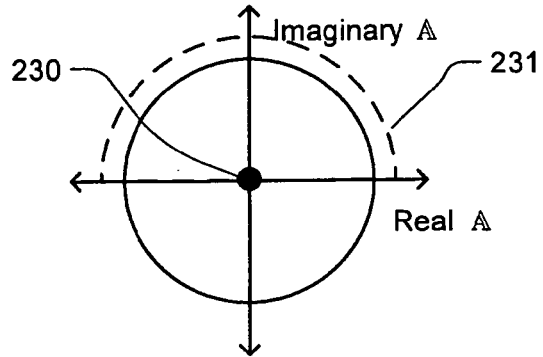
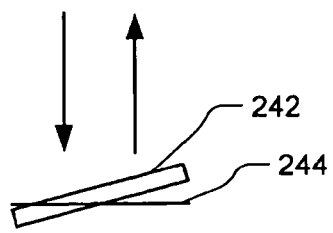
Figure 2D
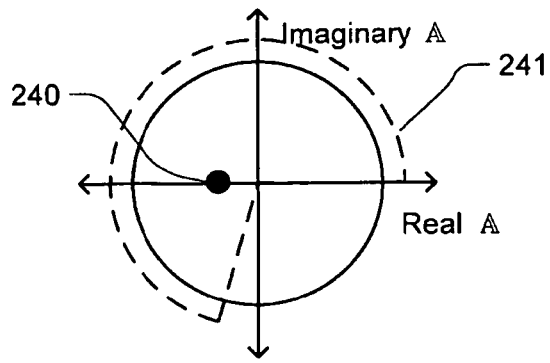

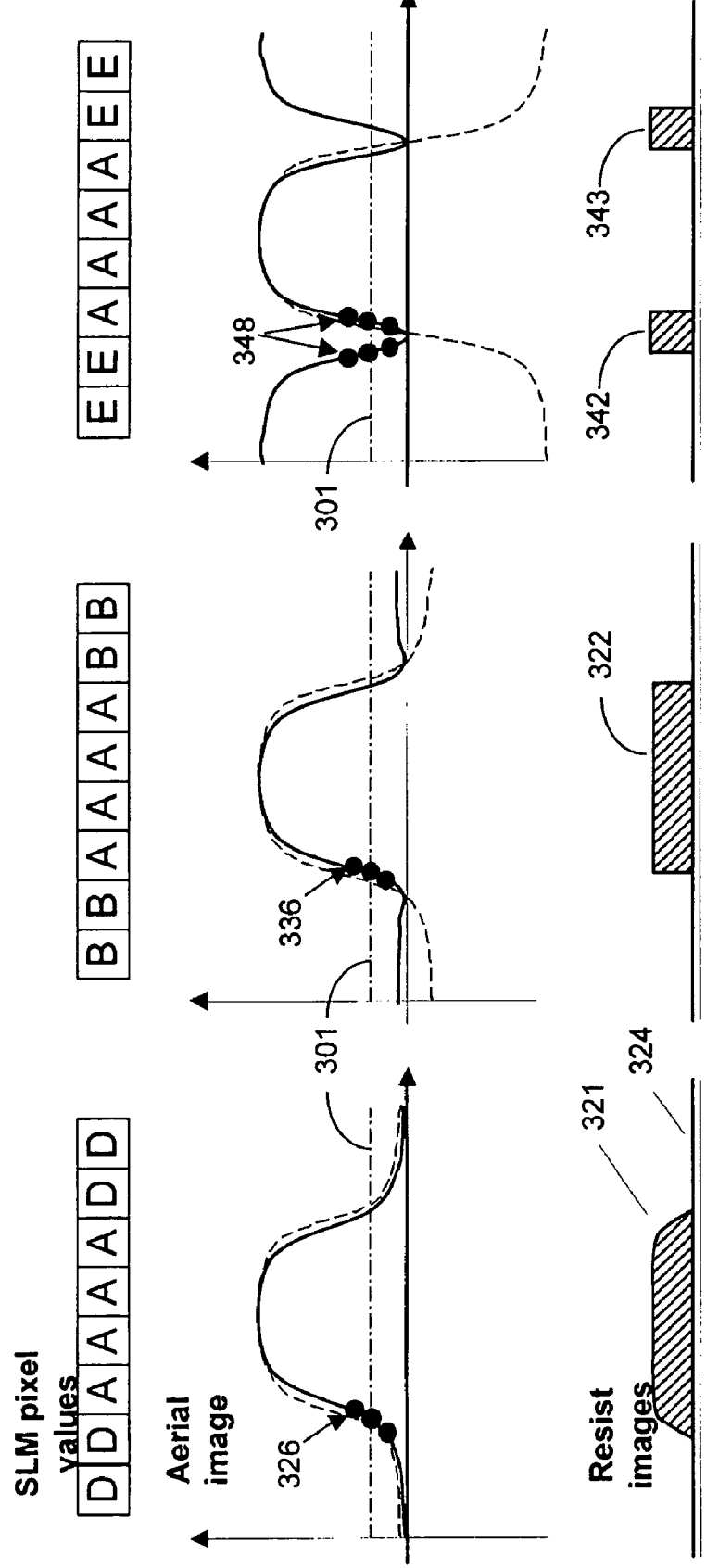

|   |   |   |   |
|---|---|---|---|
| 0 | 62 | 62 | 0 |
| 0 | 63 | 62 | 0 |
| 0 | 62 | 63 | 0 |
| 0 | 64 | 62 | 0 |
| 0 | 88 | 87 | 0 |
| 0 | 87 | 88 | 0 |
| 0 | 86 | 87 | 0 |
| 0 | 88 | 90 | 0 |

412 414
402
404
422 424

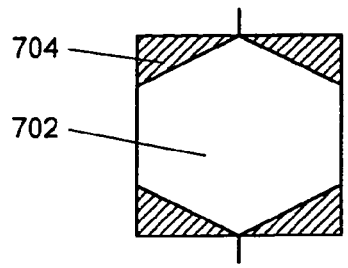 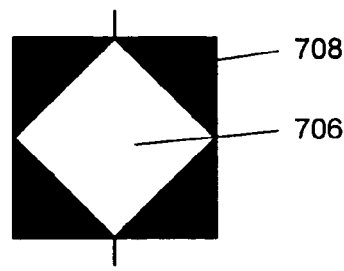 Figure 7A
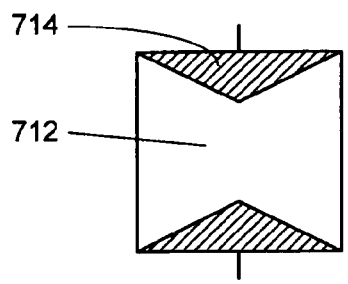 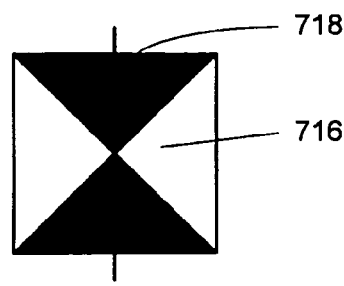 Figure 7B
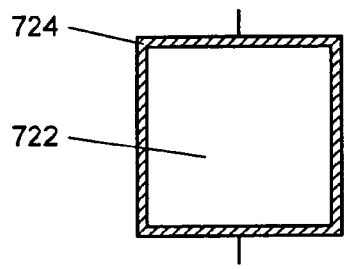 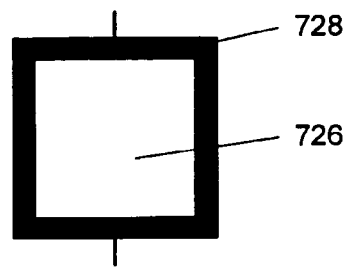 Figure 7C
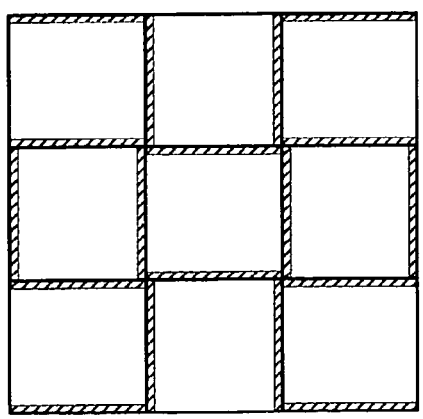 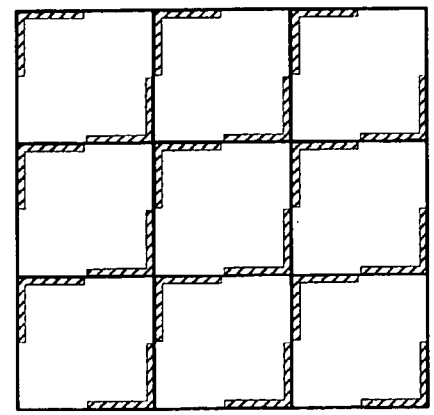
Figure 7D  Figure 7E Blanket Gray Figure 10A ial application are hereby incorporated by reference ("Writing Strategy application").

METHODS AND SYSTEMS FOR IMPROVED BOUNDARY CONTRAST

PRIORITY CLAIMS

This application is a divisional of U.S. patent application Ser. No. 10/462,010, entitled "Methods and Systems for Improving Boundary Contrast" by inventor Torbjörn Sandström, filed on 12 Jun. 2003. This application claims the benefit of provisional Patent Application No. 60/415,509, entitled "Resolution Extensions in the Sigma 7000 Imaging SLM Pattern Generator" by inventors Torbjörn Sandström and Niklas Eriksson, filed on 1 Oct. 2002; No. 60/444,417, entitled "Further Resolution Extensions for an SLM Pattern Generator" by inventors Torbjörn Sandström and Niklas Eriksson, filed on 3 Feb. 2003; and No. 60/455,364, entitled "Methods and Systems for Process Control of Corner Feature Embellishment" by inventors Torbjörn Sandström, Hans Martinsson, Niklas Eriksson and Jonas Hellgren, filed on 17 Mar. 2003; and further claims priority as a continuation-in-part of the international application designating the United States submitted and to be published in English, Application No. PCT/SE02/02310, entitled "Method and Apparatus for Patterning a Workpiece" by inventor Torbjörn Sandström and Peter Duerr, filed on 11 Dec. 2002 and claiming priority to the Swedish Application No. 0104238-1 filed on 14 Dec. 2001; and further claims priority as a continuation-in-part of the international application designating the United States submitted and to be published in English, Application No. PCT/EP03/04283, entitled "Method and Apparatus for Controlling Exposure of a Surface of a Substrate" by inventors Torbjörn Sandström and Peter Duerr, filed on 24 Apr. 2003. These provisional and international application are hereby incorporated by reference.

RELATED APPLICATIONS

This application is related to the U.S. Pat. No. 6,833,854, entitled "Method for High Precision Printing of Patterns" by inventor Torbjörn Sandström, issued on 21 Dec. 2004 and filed on the same day as U.S. patent application Ser. No. 10/462,010, which is hereby incorporated by reference ("High Precision Printing application"). It also is related to U.S. patent application Ser. No. 10/335,981 entitled "High Energy, Low Energy Density, Radiation-Resistant Optics Used with Micro-Electromechanical Devices" by inventors Grebinski, et al., filed Jan. 2, 2003, which is hereby incorporated by reference. It is also related to U.S. patent application Ser. No. 09/954,721, entitled "Graphics Engine for High Precision Lithography" by inventors Martin Olsson, Stefan Gustavson, Torbjörn Sandström and Per Elmfors, filed on 12 Sep. 2001, which is hereby incorporated by reference ("Graphics Engine application"). It is further related to U.S. patent application Ser. No. 10/238,220, entitled "Method and Apparatus Using an SLM" by inventors Torbjörn Sandström and Jarek Luberek, filed on 10 Sep. 2002 ("Blanket Gray Calibration application"), which claims the benefit of provisional Patent Application No. 60/323,017 entitled "Method and Apparatus Using an SLM" by inventors Torbjörn Sandström and Jarek Luberek, filed on 12 Sep. 2001, both of which are hereby incorporated by reference. It is also related to U.S. patent application Ser. No. 09/992,653 entitled "Reticle and Direct Lithography Writing Strategy" by inventor Torbjörn Sandström, filed on 16 Nov. 2001 which is a continuation of application Ser. No. 90/665,288 filed 18 Sep. 2000, which is hereby incorporated by reference ("Writing Strategy application").

BACKGROUND OF THE INVENTION

The present invention relates to methods and systems that define feature boundaries in a radiation sensitive medium on a workpiece using a diffraction-type micromirror array, extending to production of patterns and structures on a semiconductor substrate. Workpieces include lithographic masks, integrated circuits and other electronic and optical devices. Particular aspects of the present invention are described in the claims, specification and drawings.

Two main types of radiant energy used to generate patterns for integrated circuit or device production are photon beam(s) and electron beam(s). Systems using multiple scanned photon beams are more generally available than systems using multiple electron beams. Photon or laser pattern generator systems usually are faster but less precise than e-beam systems. Multiple, relatively wide beams in a laser scanning system have different characteristics, than a single electron beam in a vector-driven e-beam system. Embellishments can be used in mask writing with a laser scanning system to compensate partially for the larger beam width of the photon beam.

For direct writing applications, photon-exposing radiation may be preferred, because an electron beam may adversely affect layer properties of the integrated circuit. Both at the substrate and in electron charge-trapping layers of the integrated circuit, electrons that pass through a resist layer that is being patterned may damage or change characteristics of the layer below the resist. These modified characteristics may have undesirable effects on device performance. Photon-based writing devices have the further advantage of generally being faster than electron beam devices.

These inventors are continuing development of a new kind of pattern generator that uses photon-exposing radiation. Instead of using one or more scanned laser beams, the new kind of pattern generator uses a micromirror array, in one embodiment, a spatial light modulator ("SLM"), and a pulsed illumination source to print so-called stamps across the face of a workpiece. The Graphics Engine application referenced above is one of several applications with overlapping inventors that disclose aspects of this new kind of pattern generator. These co-pending applications also teach that other kinds of micromirror arrays that may be used with pulsed illumination to print stamps.

The micromirror array under development relies on diffraction, rather than deflection, to produce contrast in the radiation sensitive medium. By use of diffraction, small movements of micromirrors induce scattering of radiation. The scattering corresponds to so-called destructive interference among components of radiation relayed from a single micro-mirror in an object plane. Apertures and other optical components translate the scattering into gray-scaled intensity variations in an image plane corresponding to the radiation sensitive medium on the workpiece.

A single micromirror in the object plane produces a Gaussian distribution of intensity in the image plane. By various approximations, the intensity distribution of a single micromirror affects an area generally corresponding to a 3×3 or 5×5 grid of micromirrors. Conversely, the intensity of exposing radiation at a spot in the image plane may depend on the orientation of 9 or 25 micromirrors in the object plane.

A radiation sensitive medium, such as resist, at the image plane has some thickness and some opacity. The top and bottom of the medium respond somewhat differently to the exposing radiation. This depends on the characteristics of the medium and the contrast at boundaries between areas intended to be exposed and unexposed. Poor contrast typically produces a trench with a wide top and a narrow bottom or a non-vertical sidewall, corresponding to an iso-exposure profile through the thickness of the medium. A non-vertical sidewall compromises the placement of a boundary, due to variations in medium thickness, in particular, after erosion in etch processes. The variations in medium thickness are large, compared to the allowed critical dimension variations. The sine of a 10 or 15 degree angle is 0.1736 or 0.2588, respectively, which indicates the degree to which non-vertical sidewalls make boundary placement is sensitive to medium thickness.

An opportunity arises to improve placement and/or contrast at boundaries. A range of micromirror operation may influence boundary placement, as may a transfer function between boundary placement and micromirror tilt. Calibration methods also may improve placement and/or contrast at boundaries.

SUMMARY OF THE INVENTION

The present invention relates to methods and systems that define feature boundaries in a radiation sensitive medium on a workpiece using a diffraction-type micromirror array, extending to production of patterns and structures on a semiconductor substrate. Workpieces include lithographic masks, integrated circuits and other electronic and optical devices. Particular aspects of the present invention are described in the claims, specification and drawings.

BRIEF DESCRIPTION OF THE DRAWINGS

FIG. 2 illustrates a range of mirror tilts.

FIGS. 3C–3E depict SLM pixel values, aerial image is in resist image is corresponding to various complex amplitude ranges.

FIG. 7 depicts variations on placement of phase interference structures on the surface of a mirror, individually and as part of a micromirror array.

FIG. 16 illustrates multipass writing and FIG. 17 illustrates calibration in anticipation of multipass writing.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
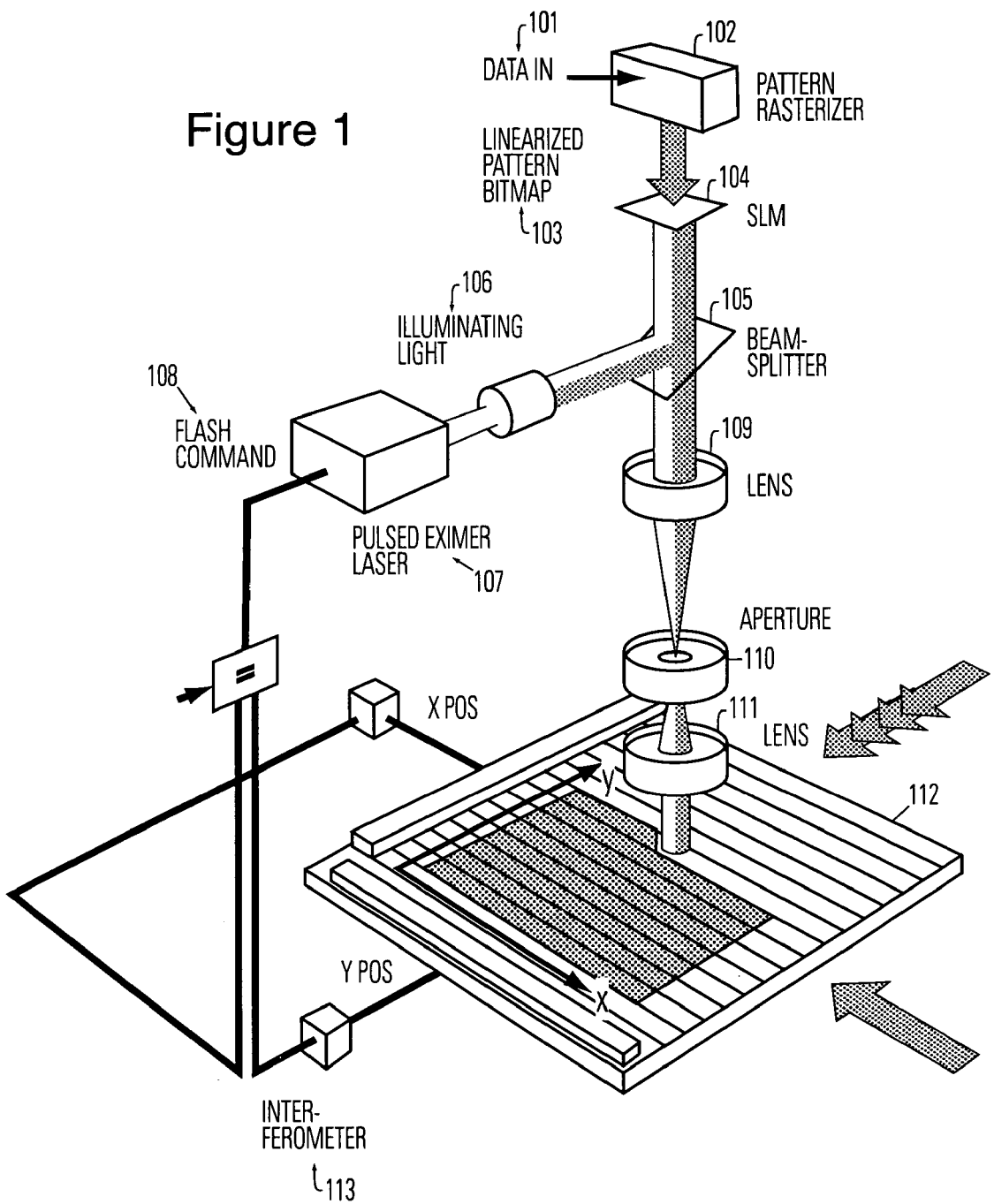
FIG. 1 depicts the general layout of a micromirror pattern generator.

FIG. 1 depicts the general layout of a micromirror array pattern generator, in one embodiment employing a spatial light modulator ("SLM"). Aspects of an SLM pattern generator are disclosed in the related pending patent applications identified above. The workpiece to be exposed sits on a stage 112. The position of the stage is controlled by precise positioning device, such as paired interferometers 113. The workpiece may be a mask with a layer of resist or other exposure sensitive material or, for direct writing, it may be an integrated circuit with a layer of resist or other exposure sensitive material. In the first direction, the stage moves continuously. In the other direction, generally perpendicular to the first direction, the stage either moves slowly or moves in steps, so that stripes of stamps are exposed on the workpiece. In this embodiment, a flash command 108 is received at a pulsed excimer laser source 107, which generates a laser pulse. This laser pulse may be in the deep ultraviolet (DUV) or extreme ultraviolet (EUV) spectrum range. The laser pulse is converted into an illuminating light 106 by a beam conditioner or homogenizer. A beam splitter 105 directs at least a portion of the illuminating light to an SLM 104. The pulses are brief, such as only 20 ns long, so any stage movement is frozen during the flash. The SLM 104 is responsive to the datastream 101, which is processed by a pattern rasterizer 102. In one configuration, the SLM has 2048×512 mirrors that are 16×16 µm each and have a projected image of 80×80 nm. It includes a CMOS analog memory with a micro-mechanical mirror formed half a micron above each storage node. The electrostatic forces between the storage nodes and the mirrors actuate the mirrors. The device works in diffraction mode, not specular reflectance, and needs to deflect the edge of the mirrors by only a quarter of the wavelength (62 nm at 248 nm) to go from the fully on state to the fully off state. To create a fine address grid the mirrors are driven to on, off and 63 intermediate values. The pattern is stitched together from millions of images of the SLM chip. Flashing and stitching proceed at a rate of 1000 stamps per second. To eliminate stitching and other errors, the pattern is written four times with offset grids and fields. Furthermore, the fields are blended along the edges. The mirrors are individually calibrated. A CCD camera, sensitive to the excimer light, is placed in the optical path in a position equivalent to the image under the final lens. The SLM mirrors are driven through a sequence of known voltages and the camera measures the response. A calibration function is determined for each mirror, to be used for real-time correction of the grey-scale data during writing. In the data path, the vector format pattern is rasterized into grey-scale images, with grey levels corresponding to dose levels on the individual pixels in the four writing passes. This image can then be processed using image processing. The final step is to convert the image to drive voltages for the SLM. The image processing functions are done in real time using programmable logic. Through various steps that have been disclosed in the related patent applications, rasterized pattern data is converted into values 103 that are used to drive the SLM 104.

In this configuration, the SLM is a diffractive mode micromirror device. A variety of micromirror devices have been disclosed in the art. In an alternative configuration, illuminating light could be directed through a micro-shutter device, such as in LCD array or a micromechanical shutter.

Micromirrors can be driven further than an "off" or quarter wavelength extinction tilt, as illustrated in FIG. 2. FIG. 2A depicts a mirror 212 perpendicular to exposing radiation. In this embodiment, a beam splitter is used to allow the input and output from the micromirror array to traverse the same path. In another embodiment, the input radiation might be at an angle to the mirror surface, so that the output was collected along a path different than the input. The complex amplitude of output from any one point on the mirror 212 can be depicted as a point on a unit circle representing its real and imaginary (phase) amplitude components. In FIG. 2A, the reference position of the mirror is considered to have a real part of +1 and an imaginary part of 0. This reference position 210 is the same for all points on the mirror 212, because it is perpendicular to the input radiation.

FIG. 2B depicts a tilt angle that is approximately one-third of a quarter wave tilt. (The tilt in the diagram is illustrative, not scaled.) The tilt of mirror 222 from the reference line 224 provides a comparison of the mirror position at the edge and the mirror position in the middle. A quarter wave tilt induces a 180 degree phase difference between light reflected from the edge and middle of the mirror. The complex amplitude of the one side of the mirror 225 is graphed on the unit circle as an arc 221. The arc 221 represents the complex amplitude of points across the face of the mirror 222, from the center to the outside edge. It should be understood that the complex amplitude of the whole mirror surface would be graphed with a second arch, reflected across the x-axis from arc 221. Only one side of the mirror is graphed in this set of figures, for clarity.

Figure 9:
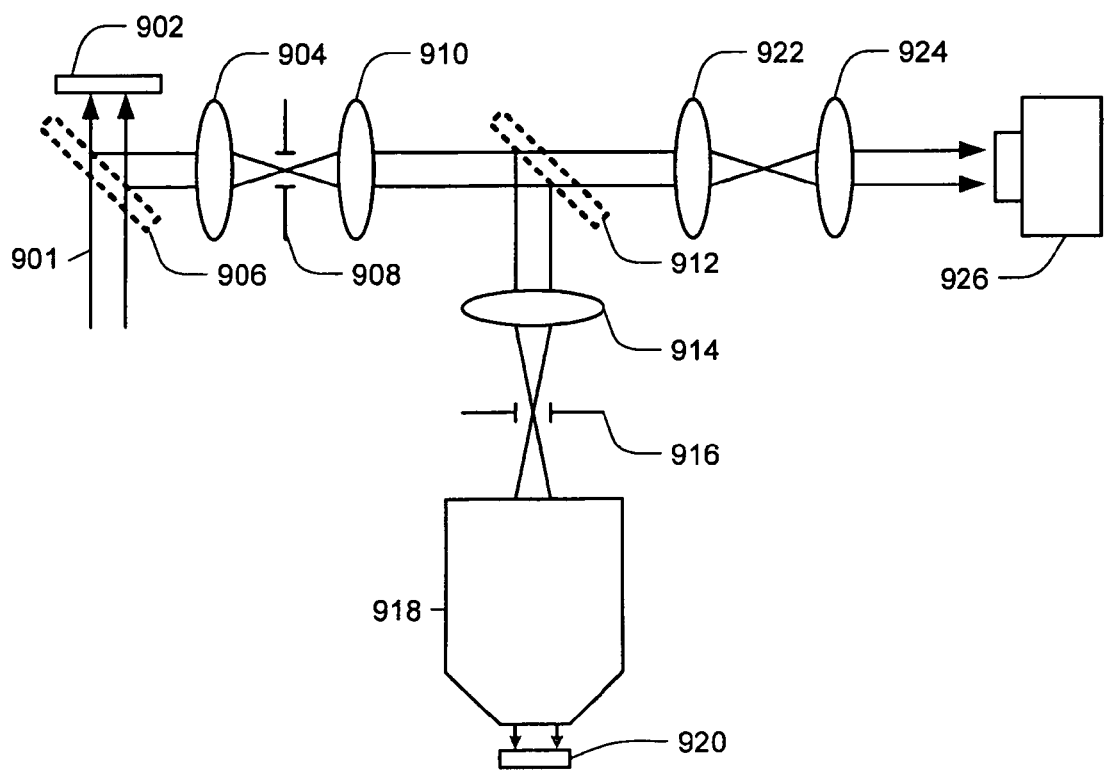
FIG. 9 is a block diagram of an optical system.

The projection optics illustrated in FIG. 9 and discussed below act as a low-pass filter. In the image, the mechanical structure of the mirror is removed by the low pass filter. What remains is the average complex amplitude over the mirror surface, which may be translated into an intensity distribution. For a surface, the average complex amplitude of the surface can be expressed by a surface integral:

$$A = A_0 \oint r \cdot e^{-j\frac{4\pi h}{\lambda}} dS$$

The resulting complex amplitude depends on an initial complex amplitude. The complex reflectance r can sometimes be taken as 1, to simplify the analysis. The deflection h is at the edge of the mirror. The wavelength λ is for one mode of the illumination.

Simplifications apply to various cases. For a typical micromirror, the surface integral dS can be simplified to a one dimensional integration dx from the right edge to the left edge of the mirror. In some instances, the cross-section of the mirror varies as a function of x. For a rectangular mirror that is not tilted, taking the reflectance as 1, a simplification is:

$$A = A_0 e^{-j\phi_0} \oint_{left\ edge}^{right\ edge} 1\, dx,$$

where $\phi_0$ is the angle at the mirror surface, which is constant for a mirror that has a flat surface.

For a rectangular mirror, a simplification is:

$$A = A_0 \oint_{left\ edge}^{right\ edge} r \cdot e^{-j\frac{4\pi h}{\lambda}} dx$$

A further simplification, again taking the reflectance as 1, is:

$$A = A_0 e^{-j\phi_0} \oint_{left\ edge}^{right\ edge} e^{-j\frac{4\pi h}{\lambda}} dx$$

In FIG. 2B, the real part of the complex integral is indicated by 220. It is in the range of the arc 221. Recall that the arc 221 also exists on the mirror side of the x-axis for a center-tilting mirror, in which case the counterclockwise and clockwise arcs have complementary imaginary parts. In FIG. 2C, a quarter wave tilt is represented. The distance that the edge of the mirror 232 has tilted away from the reference line 234 is one-quarter wavelength. Light traveling perpendicular to the mirror travels one-half wavelength less distance at the raised edge than at the mirror center, which is what gives rise to destructive interference and diffraction. The arc 231 depicts contributions to the complex amplitude of the mirror from one side of the mirror. The resulting complex amplitude 230 is graphed at the origin, which coincides with destructive interference. In FIG. 2D, over-tilting of the mirror 242 from the reference line corresponds to what can be called a "negative black." This negative black tilt angle has been analyzed and determined to have favorable properties for contrast at feature boundaries, as well as implications for mirror design, transfer functions, calibration and semi-conductor device manufacturing that are explained below. The arc 241 describes approximately 257 degrees phase difference between input and output waves, which is between a quarter wave tilt and a half wave tilt. For a mirror 16 microns wide, this corresponds to a tilt of approximately 87.5 or 88 nm at the edge and illuminated by a 248 nm source. This is a new range of tilts.

Figure 3A:
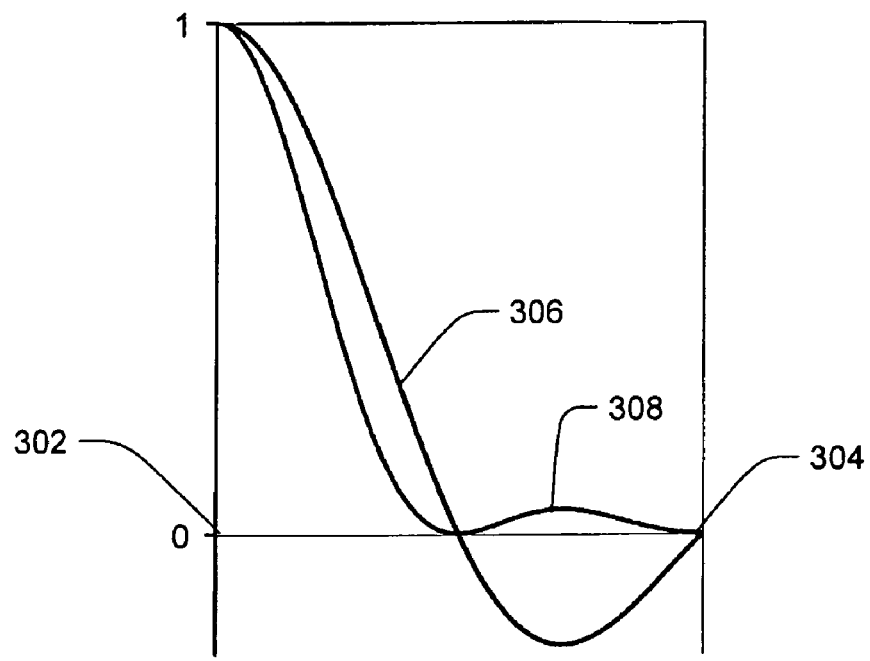
FIG. 3A illustrates complex amplitude and intensity curves.

Complex amplitude and intensity curves are depicted in FIG. 3A. These curves represent the relayed output from one micromirror among a group of micromirrors having similar tilts. The only component of destructive interference represented by these curves is interference among output components of a single micromirror. These curves previously have been disclosed in the Blanket Gray Calibration application referenced above. In that application, FIG. 6 resembles the present FIG. 3A. Generally, that application teaches setting a lower bound for a dynamic range that corresponds in FIG. 3A to a quarter wave tilt of some mirror, where the amplitude 310 and intensity 312 curves intersect at the x-axis. In their previous work, this inventor and his colleague suggested calibrating all mirrors in a micromirror array so that they would produce a similar maximum reflected output and a similar minimum reflected output. At the common minimum output, the control signal for Blanket Gray Calibration would drive a particular mirror tilt to a point typically short of a quarter wave tilt, at which the particular mirror produced a low output level that all micromirrors could attain. In this way, a consistent dynamic range could be produced and a minimum output intensity as close to zero as practical could be attained.

Figure 3B:
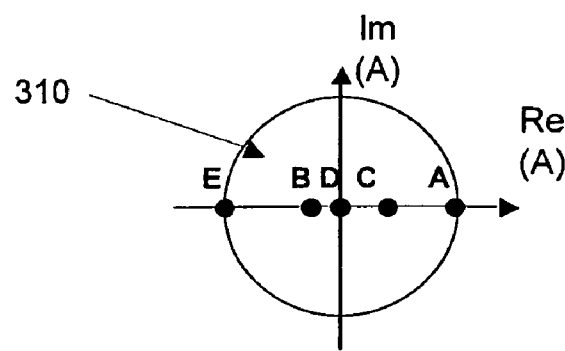
FIG. 3B depicts complex amplitudes that may be generated by various mirror configurations.

FIGS. 3A–3B depict output resulting from the new range of tilts for a mirror, for which different transfer functions and calibration strategies are proposed in this disclosure. Again, the new range of tilts is illustrated in FIGS. 2A–2D. In FIG. 3A, the complex amplitude curve 310 has a minimum real part that is below the x-axis. This minimum corresponds to the real part of the complex amplitude 240 and to the angle of the arc 241 in FIG. 2D. Corresponding to the negative valued minimum amplitude of 306, there is a local maximum intensity in the curve 308. The curve 306 is approximated by the function sin(x)/x. As the intensity curve is the square of the amplitude curve, the local maximum intensity coincides with the negative minimum amplitude.

FIG. 3B–3E illustrate how negative black exposure can be used to improve contrast in positive and negative resists. FIG. 3B is a unit circle 1600 labeled to match FIGS. 2A–D. Point A corresponds to 210 in FIG. 2A. Points B, C and D correspond to 220, 230 and 240 in FIGS. 2B–2D. Point E is added. Using certain mirror configurations that have more effective reflecting surface away from the tilting axis, as opposed to near the tilting axis (e.g., FIG. 7C, below), it is practical to design mirror with a range of tilts that produces a range of positive and negative complex amplitudes that are similar above and below the axis. That is, the shape of curve 306 in FIG. 3A, for these mirror configurations, would be similar above and below horizontal axis 302. Points A and E, for those mirror configurations, would represent min-tilt and max-tilt or the maximum positive and minimum negative amplitudes. Points A and E have similar or equal real parts and similar or equal average complex amplitudes at certain tilt angles. Because point A is taken as having a value of +1, 0 by convention for any particular mirror, the reflected output may not be the same at point "A" for two different mirrors.

FIGS. 3C–3E include coded pixel values for diffracting elements (such as mirrors,) with reference to the points marked on the unit circle. In FIG. 3C, the pattern of pixel values is DDAAAADD. In this coding, A is a bright mirror and D a dark mirror with zero complex amplitude. In this pattern, on and off mirrors are adjacent, with no negative black applied. In FIG. 3D, the pattern is BBAAAABB. A "B" mirror produces a negative amplitude, for instance a rectangular mirror tilted 87 nm. The negative amplitude is small relative to the positive amplitude. In FIG. 3E, the pattern is EEAAAAEE. This is a special pattern, produced by a mirror with a tilt range selected to produce equal positive "A" amplitude and negative "E" amplitudes. The range of operation and mirror characteristics to accomplish this are described in the contemporaneously filed High Precision Printing application.

FIG. 3C illustrates the impact of the DDAAAADD pixel pattern, both in terms of an aerial image and a resist image. In the aerial image of FIG. 3C (and FIGS. 3D–3E,) zero intensity exposure is the base line or axis and an exposure that activates the resist is a varying dashed line 301. The real part of the respective complex amplitudes are represented by a dashed line that sometimes is negative (FIGS. 3D–3E). The intensity profiles that correspond to the square of the complex amplitude represented by a solid line that always is positive. In FIG. 3C, the complex amplitude and intensity curves are similar. The relative position of three points 326 indicates the sharpness of the contrast, with a vertical stack of dots representing high contrast. These dots may represent how the image is viewed by adjacent pixels of a sensor or camera. More vertical dots would correspond to more variation of readings taken from adjacent pixels of a sensor array. The stack of dots in 3C is less vertical than in the other figures, which corresponds to relatively slanted sidewalls in the resist image 322 on the substrate 324. For convenience of illustration, the resist image is shown after development, but a similar latent image is formed in any radiation sensitive layer on a substrate, whether a mask or some kind of device.

FIG. 3D illustrates a higher contrast at the sidewalls of the resist 332, corresponding to a more nearly vertical stack of dots 336. The dashed curve of the aerial image includes some negative complex amplitude. As a result the solid intensity curve has a small positive value in the area where the developed resist is supposed to be removed. However, the small positive intensity at the outside edges of the curve is below the threshold 301 at which the resist is triggered, so the resist image 322 has the desired shape and more nearly vertical sidewalls than in FIG. 3C.

FIG. 3E is different from the preceding figures, because it assumes a negative resist or radiation sensitive layer. That is, the resist images 342, 343 remain where there is minimal exposure below the threshold 301, instead of maximal exposure above the threshold. Radiation intensity above the threshold 301 triggers the negative resist, but to make removable by etching instead of hardening it against etching. The dashed complex amplitude curve extends about as far below the axis as above it, so the solid intensity curve has similar or equal heights in each of the three nodes. The stack of points 348 is more nearly vertical than in the preceding figures, corresponding to more nearly vertical sidewalls of the resist images 342, 343. The more nearly vertical the sidewalls, the less the effect of variations in thickness of the radiation sensitive layer and of other variations in the development process.

Figures 4, 5:
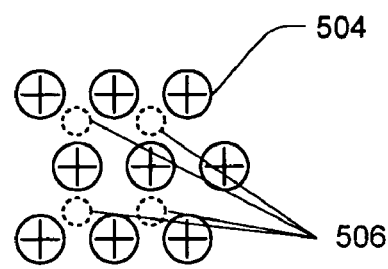
FIG. 4 illustrates the impact of using a negative black tilt on imperfect mirror tilt.
FIG. 5 illustrates production of side lobes.

FIG. 4 illustrates the impact of using a negative black tilt on imperfect mirror tilt. This figure assumes that the same mirror tilt is desired, but not attained for all dark mirrors. That is, in the rows 402, the desired quarter wave mirror tilt is 62 nm (for a 248 nm wavelength.) However, the actual mirror tilt attained may range from 61 to 64 nm. As a result, the boundaries 412 & 414 between dark and bright (0 tilt) mirrors undulate, are not straight. Simulations using sophisticated methods and optical analysis software such as SOLID-C have demonstrated that a negative black tilt for dark mirrors de-emphasizes the effect of imperfect mirror tilt. In rows 404, dark mirror tilts rage from 86 to 90 nm. Recall from FIG. 3A that curve 304 is much flatter near its negative minimum than where it crosses the axis 302. Similar observations can be made of the dashed curves in FIGS. 3D–3E. The negative amplitude of the dark mirror interacts with the positive amplitude of the adjacent bright mirror. The interaction is less critical when the negative amplitude is in a relatively flat portion of the curve. Boundaries 422 & 424 are straighter than 412 & 414, because they are relatively insensitive to imperfect mirror tilt. In FIG. 4, bright mirrors are adjacent to dark mirrors. In this configuration, the effect of the negative black tilt on contrast along the boundary is especially strong. While it has been suggested that one could try to capture a 15 to 30 percent improvement in edge sharpness (e.g., commonly owned U.S. Pat. No. 6,373,619 B1, cols. 6–7 (Apr. 16, 2002)), recent development has addressed practical issues of doing so and has revealed that contrast can be increased much more substantially than previously suspected. One of the practical issues studied is the impact of gray mirrors between bright and dark mirrors, e.g., 30 nm tilted gray mirrors between 0 and 62 nm tilted bright and dark mirrors. Analysis indicates that a two-fold improvement in critical dimension uniformity can be achieved using negative black tilt, even when gray mirrors occur between the bright and dark mirrors. The combination of strongly negative amplitudes and negative resists and the issue of gray intermediate mirrors do not appear to have been previously discussed in the inventor's applications.

FIG. 5 illustrates production of side lobes that can result from use of negative black. Side lobes are a phenomenon sometimes discussed in the context of attenuated phase shift masks. Suppose that exposures intended at targets 502. Small groups of mirrors, or single mirrors, produce a Gaussian distribution that is partially represented by circles 504. Curve 312 of FIG. 3A indicates that there will be a residual intensity (e.g., 4.8 percent of the maximum intensity) at a tilt beyond the zero intensity tilt, at the local maximum. Depending on the magnitude of the residual intensity, sidelobes 506 may be formed where residual intensities overlap from several adjacent targets. For instance, sidelobes may be formed where serifs upon serifs are printed for optical proximity correction purposes. The magnitude of the residual intensity depends on the shape of the mirrors in the micromirror array.

Figure 6:
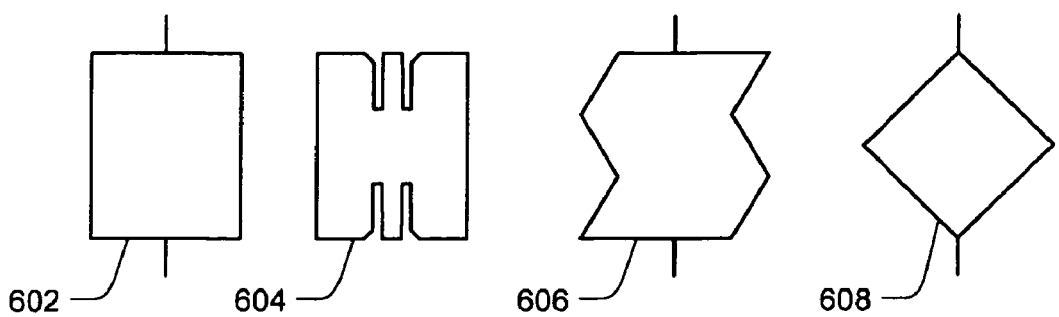
FIG. 6 illustrates different mirror shapes, array configurations and surface profiles that influence sidelobe production.
Figure 6:
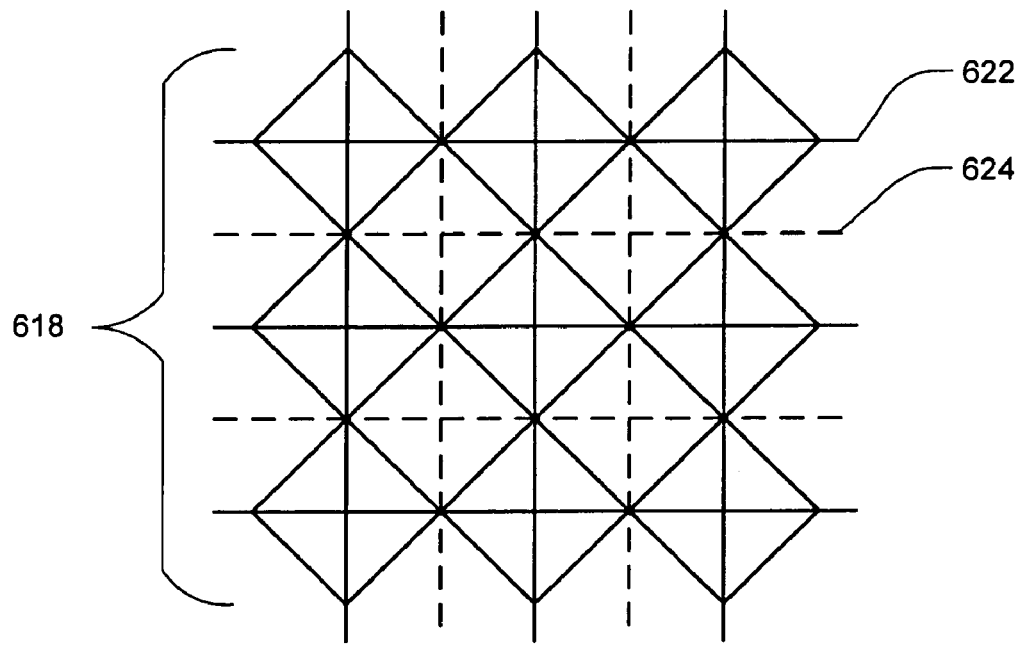
Figure 6:
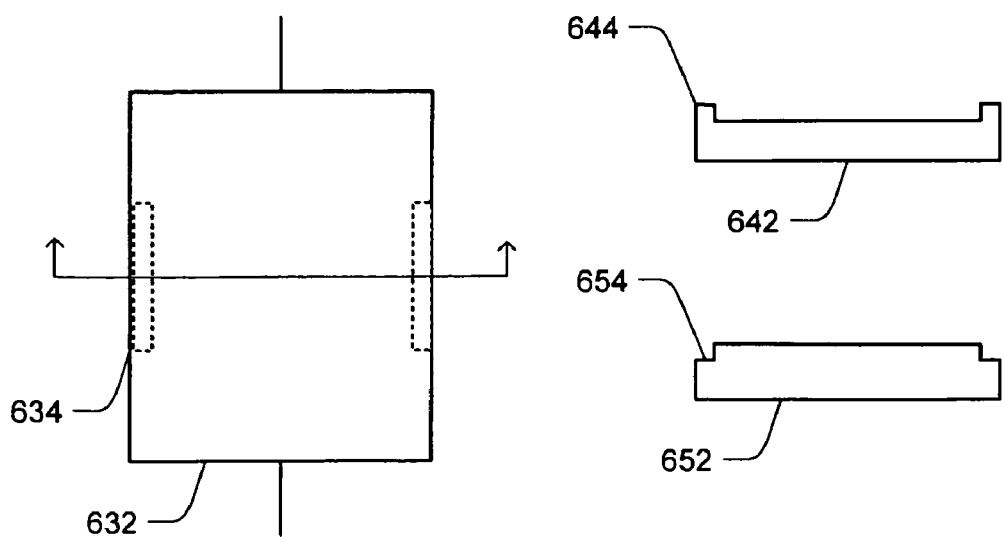

FIG. 6 illustrates different mirror shapes, array configurations and surface profiles that influence sidelobe production. Mirror 602 has been shown by sophisticated simulations to produce a residual intensity of approximately 4.77 percent. A mirror like 604 produces a greater residual intensity, in a range of 6 to 8 percent. Mirror 606 produces less than 4.77 percent residual intensity. Using mirror 608, which pivot along an axis between opposed corners, reduces residual intensity close to zero percent, whether the footprint is a square or a diamond. However, mirror 608 produces a more difficult printing array than any of the other footprints. To efficiently reflect radiation projected onto the array 618, micromirrors of design 608 are arrayed along a pair of offset axes 622 and 624. The approaches describe in the Graphic Engine application do not work as nicely with a diamond shaped mirror and pair of axes as an array that has a single set of axes.

The bottom images of FIG. 6 depict an approach that in can obtain the reduced residual intensity of mirror 608 and the regular array configuration of mirrors 602, 604 and 606. The mirror 632 is a rectangle, but could be another regular shape. The surface of the mirror has areas 634 that are at different heights, as illustrated by the cross-section. The raised section 644 shown in the cross section are about a quarter wave above the main surface of the mirror 642. These sections cause destructive interference and diffraction through a range of mirror tilts. A raised surface area of one unit cancels out a lower surface area of the same size and at the same distance from the tilting axis. FIG. 7 illustrates various potential placements of raised area, corresponding to 634 in FIG. 6.

FIG. 7 depicts variations on placement of phase interference structures on the surface of a mirror, individually and as part of a micromirror array. In FIG. 7A, the interference structures 704 are placed at the corners of the mirror, leaving a diamond-like shape 702 in the middle of the mirror. The effect of the interference structures 704 is to cancel out twice their surface area in reflected output, in a pattern like 708, leaving an interior area 706 effectively producing reflected output. The interference structures 704 yield an interior area 706 that resembles the reflective area of mirror 608 in FIG. 6. The mirror using interference structures 704 is rectangular, so an array can be formed with mirrors arranged so that centers of reflecting surfaces are aligned in rows and columns, without the need for offset rows and columns on a second set of axes that is depicted in array 618 of FIG. 6. When the array is formed, substantially all of the array can be covered by mirrors with interference structures. Having a relatively small area of the array either uncovered or open as trenches between mirrors reduces the stray radiation that needs to be dealt with. This stray radiation might otherwise be reflected along the optical path in undesirable directions, absorbed by the array, or channeled under the mirrors where damage can result to mirror actuating components. (For further discussion of the potential damage to mirror actuating components, see commonly owned U.S. patent application Ser. No. 10/335,981 entitled "High Energy, Low Energy Density, Radiation-Resistant Optics Used With Micro-Electromechanical Devices" by inventors Grebinski, et al., filed Jan. 2, 2003 and incorporated herein by reference.) The use of mirrors with interference structures that substantially cover the mirror array in a regular grid with reduced incidental reflection along the optical path is desirable. The use of mirrors with interference structures that substantially cover the mirror array in a regular grid with reduced exposure of components below the mirror surface to stray radiation also is desirable. The reflecting surface footprint of mirror in FIG. 7A has a substantially central tilting axis and similar reflecting areas on opposing sides of the tilting axis. In this embodiment, the reflecting areas on opposite sides of the tilting axis are symmetrically reflected across the tilting axis. In another embodiment, such as mirror 608 of FIG. 6, the reflecting surface could be twice reflected (across the tilting axis and then along the tilting axis) or symmetrical about a center point of the mirror. The interference structures on opposing sides of the tilting axis produce less reflect output intensity away from the tilting axis than at or near the tilting axis. In this embodiment, the effective reflecting surface is a triangle with its base along the tilting axis and its apex at the edge away from the tilting axis. The interference structures are positioned closer to the opposing edges of the mirror than to the tilting axis. The interference structures 704 preferably are offset above or below the level of the main reflecting structure 702 by an odd multiple of a quarter wavelength. Any odd multiple of a quarter wavelength will produce a 180 degree phase difference between light reflected from the interference structures 704 and the reflecting surface 702. One of skill in the art will recognize that the characteristics described above from FIG. 7A may be combined in many variations to produce useful mirror structures.

FIG. 7B depicts another arrangement of phase-shifted interference structures. The interference structures 714 are larger near the tilting axis than away from the tilting axis. In this variation, the reflecting surface 712 produces more reflected output intensity 716 (proportional to effective reflecting area) away from near the tilting axis than at or near from the tilting axis. The effectively diffracted area 718 is again approximately twice as large as the interference structure 714. Removing effective reflecting area close to the tilting axis makes the minimum complex amplitude more negative. Thus, it increase the amount of "negative black," giving higher contrast and edge acuity and at the same time more potential sidelobes. The eventuality of sidelobes leads to use of negative resist when the curve resembles FIG. 3E.

Taken together, FIGS. 7A–7B demonstrate that the amount of negative black that a mirror generates when tilted can be tailored by using different interference structures on mirrors having the same basic footprint and layout. A wide range of requirements can be met without reconfiguring the mirror footprint or layout.

FIG. 7C depicts using phase interference structures 724 around the perimeter of the reflecting surface 722 to produce effectively smaller mirrors. The effectively diffracted area 728 gives a smaller mirror profile 726 which may project smaller intensity distribution, thereby increasing the spatial resolution, especially with multiple writing passes. The effective radius of distribution might be reduced by half, for instance, by perimeter interference structures. This effective reflecting area reduction could be duplicated on adjacent mirrors or on alternating rows of mirrors or on a checkerboard pattern of mirrors. Two sides (FIG. 7D) or two corners (FIG. 7E) of each mirror could have perimeter interference structures, such that the array would have complementary interference structures, when adjacent mirrors and their interference structures were considered. The perimeter interference structures may be set back a short distance from the edge of the mirror, to establish an interference effect along the boundary between two bright mirrors, instead of in-phase constructive interference between adjacent interference structures.

Figure 8:
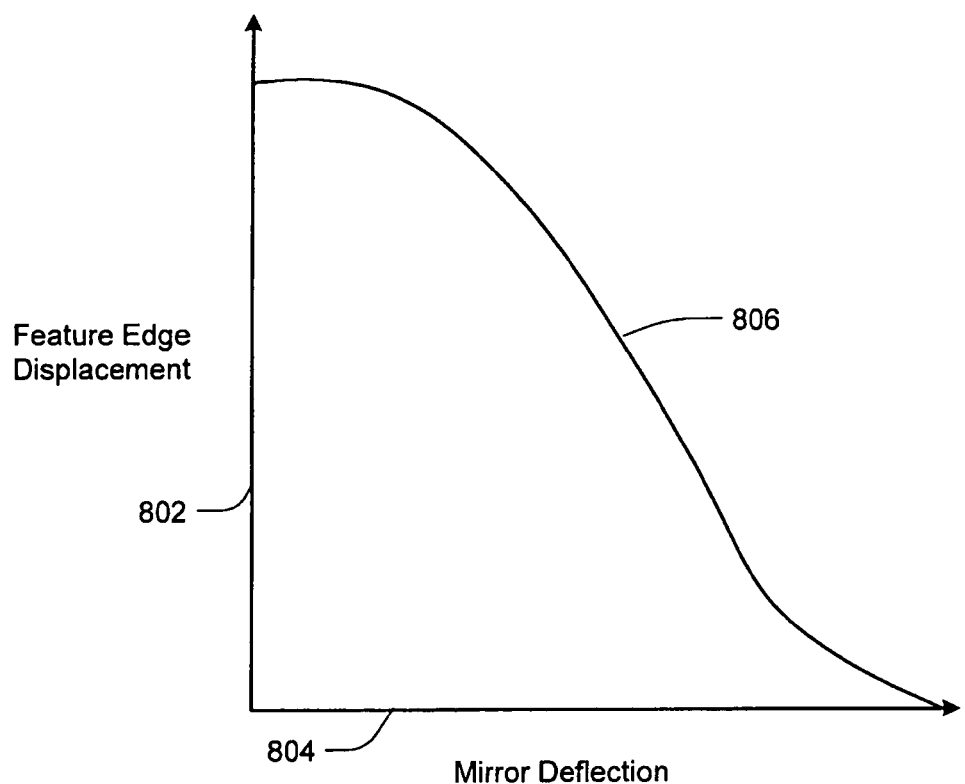
FIG. 8 depicts a transfer function.

One or more transfer functions translate a desired feature displacement into a mirror deflection. One needed transfer function translates a feature displacement into a mirror tilt. A gray scale value can be used as a short hand for feature displacement, though the relationship between photographic grays may not translate linearly to feature displacement. A displacement-to-tilt function can be combined with a driving voltage function or other transfer functions that realize a desired feature displacement in the operation of micromirror array hardware. FIG. 8 depicts a transfer function. The y-axis 802 corresponds to feature edge displacement. In other words, where in the exposure sensitive medium will the exposure be sufficient to set (in a positive medium) the medium? The x-axis 804 corresponds to mirror deflection. The curve 806 relates one to the other. As expected, as mirror deflection reaches max-tilt, the curve is flatter and less sensitive to imperfect tilt. One should understand that this transfer function, laid over the amplitude curve 310 and intensity curve 312, extends into the negative amplitude range. Unlike the intensity curve 312 of FIG. 3, this curve montonically falls from a high edge displacement at min-tilt to a low edge displacement at max-tilt. Over this range of operation, the output intensity of a micromirror among other similarly tilted micromirrors would actually increase (e.g., as tilt increased from 62 to 87.6 nm.) However, the function is monotonic because the resulting intensity in the image plane of a negative black micromirror near a bright micromirror is reduced by destructive interference and diffraction resulting from interaction between the negative black and bright mirrors. A transfer function relating feature edge displacement to mirror deflection (or its proxy, such as deflection actuation voltage) is a practical way to improve contrast at a feature boundary using negative deflection.

Calibration is required to take into account the performance individual mirrors, as explained in other commonly owned applications and patent, including the Blanket Gray Calibration application. Ongoing development has included new calibration methods, some of which are particularly useful in calibrating mirrors with a negative black max-tilt. An optical system that can be used for calibration is depicted in FIG. 9. Those of skill in the art will appreciate that orientations of the components can be changed and additional optical components can be added or substituted for use with the calibration methods described above. In FIG. 9, an illuminating radiation 901 is projected onto a micromirror array 902. This radiation typically is pulsed, either from a pulsed source or by interrupting a continuous source. The array, in the object plane, is actuated to generate a pattern. Light reflected from the array is directed to a partially reflecting surface, such as a beam splitter 906 and relayed to a first lens assembly or an equivalent focusing mirror. An aperture 908 is positioned in a Fourier plane. This aperture may be smaller (stopped down further than) or larger than aperture 916. Exposing radiation is directed through a second lens assembly 910 to another partially reflecting surface 912, which directs part of the radiation to a workpiece 920 and part of the radiation to a calibration sensor 926. The radiation directed towards the workpiece 920 passes through a third lens assembly 914, a second aperture 916 and a fourth lens assembly 918. It typically is focused on a radiation sensitive layer on a workpiece 920. The radiation directed towards the calibration sensor 926 passes through a fifth and sixth lens assembly 922, 924. Optionally, an additional aperture could be positioned between lens 922 and lens 924. It is expected that the reduction ratio at the workpiece 920 will produce a smaller image than at the calibration sensor 926. The calibration sensor may, for instance, be a Charged Coupled Device (CCD) camera, a MOS camera, or a Charged Injection Device (CID). A CCD-camera is for example a camera from Kodak® KAF 1600 with approximately 1000*1600 pixels and sensitivity for the wavelength used, e.g. 248 nm or 197 nm. Typically, this sensitivity involves converting the radiation to visible light by a fluorescent dye, but camera chips which are directly sensitive to short wavelength, e.g. 248 nm are also available. Preferably, the dose of electromagnetic radiation lies around 0.8*max range of the sensor. With a too low dose projected onto the sensor, the signal to noise ratio will in some cases be unacceptable low. With a too high dose projected onto the sensor, the sensor will be over saturated, with the result of an inaccurate measurement.

Before the SLM can be calibrated, the SLM pixels must be mapped onto the sensor array or camera, so that geometric relationship between the sensor and the pixels is established. An image consisting of a relatively coarse grid of spots, typically bright in a dark background or vice-a-versa, is imaged by the mirrors. The position of each spot is computed and a distorted grid is fitted. The distortion map is used to find which pixels on the mirror array correspond to particular elements of the sensor array. More detail and variations on this process are presented in the Blanket Gray Calibration application.

FIG. 10 depicts various patterns that can be used with calibration techniques, including new methods. FIG. 10A depicts a pattern produced by so-called blanket gray calibration, as described in the Blanket Gray Calibration application. In this method, all of the pixels in a field are nominally set to the produce the same reflected output. Pixels such as 1010 that vary from the others produce a different intensity in portions of the image plane. Iteratively, the output from the pixels found to produce a different intensity is adjusted to match neighboring pixels. This calibration method tracks pixel output intensity along a curve more like curve 310 in FIG. 3B than like curve 312 or transfer function 806 in FIG. 8.

Figure 10B:
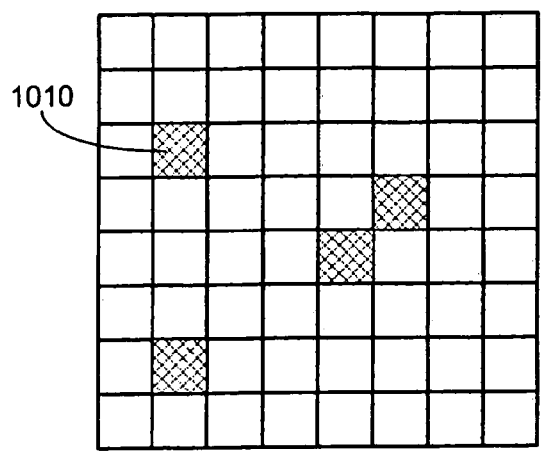
FIG. 10 depicts various patterns that can be used with calibration techniques.
Figure 10B:
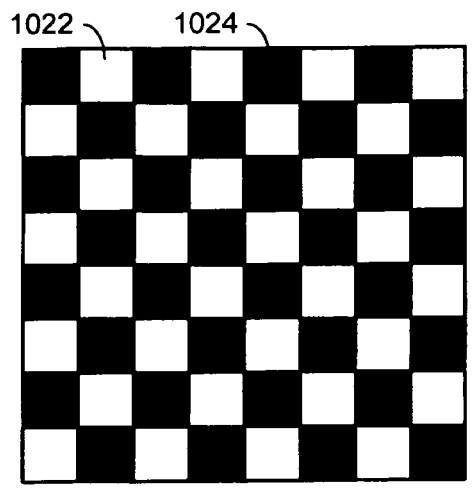

FIG. 10B presents a checkerboard calibration method. Instead of setting a field of pixels to produce the same reflected output intensity, half of the pixels in a checkerboard pattern 1022 are set to a bright (or dark) value. The other half of the pixels 1024 are varied through a range from somewhat gray to negative black (or bright). This calibration method generates a transfer function like 806 in FIG. 8, because interaction between adjacent pixels in different tilt modes impacts the intensity in the image plane.

Figure 10C:
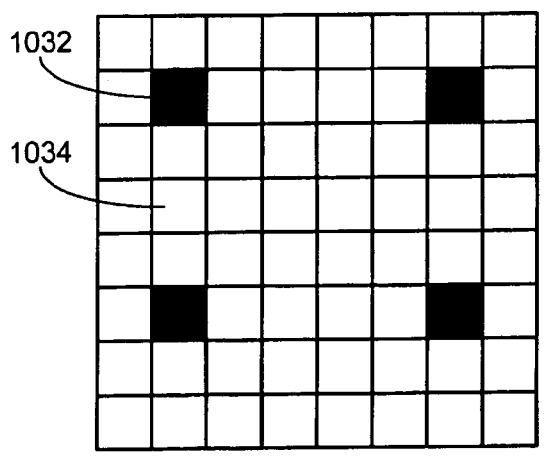

FIG. 10C presents a sparse checkerboard calibration method. This pattern spaces non-bright pixels well apart. By one metric, the non-bright pixels 1032 are separated by three, four or five bright pixels 1034. By another metric, separation between non-bright pixels relates to the image plane intensity profile of a single mirror. This intensity profile, more likely generated by simulation than measurement, corresponds to a distribution of intensity generated in the image plane from radiation corresponding to a particular bright pixel, without interference or contribution from other pixels. The bright pixel may be fully bright (e.g., at min-tilt) or a selected bright corresponding to a constrained min-tilt for the dynamic range used in operation of the pixel. The metric is the root mean square of the intensity distribution. A standard definition of RMS is adapted for this metric:

$$intensityRMS = \sqrt{\frac{\oint E(r) \cdot r^2 \, dr}{\oint E(r) \, dr}}$$

Following the standard definition, r is a position in the image plane at a distance r from the center of an intensity distribution, E(r) is a measure of the intensity or exposing dose in the image plane at r. Preferably, this value is computed after removing background exposing energy from sources other than the bright pixel using the following, slightly simplified double integral:

$$intensityRMS = \sqrt{\frac{\iint E(x, y) \cdot ((x - x_0)^2 + (y - y_0)^2) \, dx \, dy}{\iint E(x, y) \, dx \, dy}}$$

In this formulation, (x, y) coordinates are provided for the point r. The limits of integration cover at least the center of the distribution, $(x_0, y_0)$ and a range that includes substantially all of the exposing dose from the bright pixel. Alternatively, the integration could be performed using polar coordinates, again over a range that includes substantially all of the exposing dose from the bright pixel. The separation of non-bright pixels is k*intensityRMS, measured center-to-center, so that a pair of non-bright pixels are separated by 2*intensityRMS if the centers of their intensity distributions in the image plane are separated by the distance 2*intensityRMS. Non-bright pixels have a separation of greater than or equal to 2*intensityRMS, 3*intensityRMS, or 4*intensityRMS. The 2*intensityRMS, 3*intensityRMS, or 4*intensityRMS metric may better apply to micromirror configurations with perimeter interference structures, such as in FIGS. 7C–7E, than would a bright mirror count metric. Preferably, the separation between non-bright mirrors is greater than or equal to 4*intensityRMS. Less preferably, the separation may be 2*intensityRMS or 3*intensityRMS. These separations greatly simplify the task of isolating the intensity distribution or effect of one particular non-bright mirror projecting onto the image plane. Response of an individual mirror can be calibrated from bright through gray to negative black in a sparse checkerboard pattern. A sparse checkerboard pattern is shifted about the micromirror array until all of the individual mirrors have been calibrated. A greater number of sparse checkerboard patterns need to be used for calibration than checkerboard patterns, because one in sixteen or one in twenty five pixels are non-bright in a sparse checkerboard, instead of one in two in a normal checkerboard. The increased number of patterns used is likely to be offset by a reduced number of iterations required to isolate interactions between non-bright pixels spaced 4*intensityRMS away from one another.

Figure 10D:
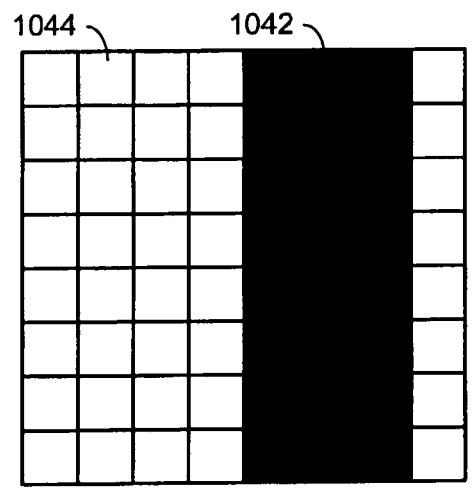
Figure 10E:
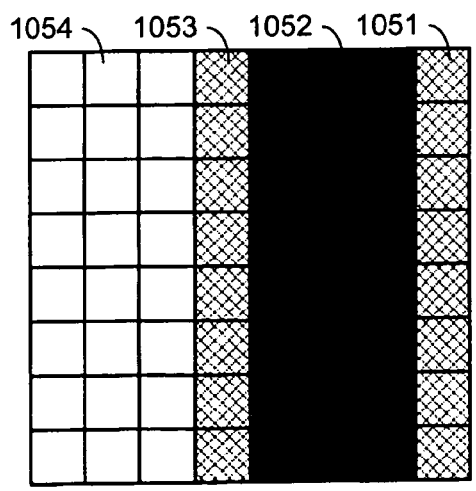

FIGS. 10D–10E illustrate another calibration method in which dark pixel bands are swept across bright pixel fields, bounded by non-bright pixels. FIGS. 10A–10E can be used to explain improved calibration methods. The micromirrors, and in a more general case any SLM elements modulating the complex amplitude or intensity, can be calibrated using the intensity produced in the image as it is picked up by a sensor or camera. In FIG. 10A, all mirrors are driven to a first approximation of uniform gray, typically by applying the same modulation (voltage) to all elements. The measurement of the actually produced gray value and how it varies over the array in the image produced on the camera (e.g., pixels 1010) provides information to refine the modulation of particular elements. Iterating the procedure improves the approximation until a good uniform gray camera image has been produced, as described in the Blanket Gray Calibration application. The voltage map is recorded as a calibration map. After several gray values have been calibrated, the maps are condensed into the mirror parameter map.

Improved photometric calibration procedures use a pattern where some mirrors are bright and others are dark or non-bright and the resulting level of gray is measured, instead of trying to drive the mirrors to a uniform gray. One improved method uses a checkerboard pattern (FIG. 10B) of bright and non-bright elements to calibrate the dark value, based on the produced uniform gray image produced. Another improved method uses a background of one color, e.g. bright or dark, and isolated elements driven to another color, e.g. non-bright or non-dark (FIG. 10C) and the gray value produced by the isolated elements is measured and calibrated. These improved calibration methods can be shown to give better results in the end of the dynamic range, particularly at the dark end of the dynamic range.

In a lithographic system the photometric properties of the mirrors are coupled to the printing properties, but they are not by themselves of any importance. Intensity, for instance, is important because of its effect on the placement of the edges in the image. The improved calibration may include driving the micromirror array with line patterns as illustrated in FIGS. 10D–10E and calibrating pixels along the boundary between bright and dark.

Figure 11:
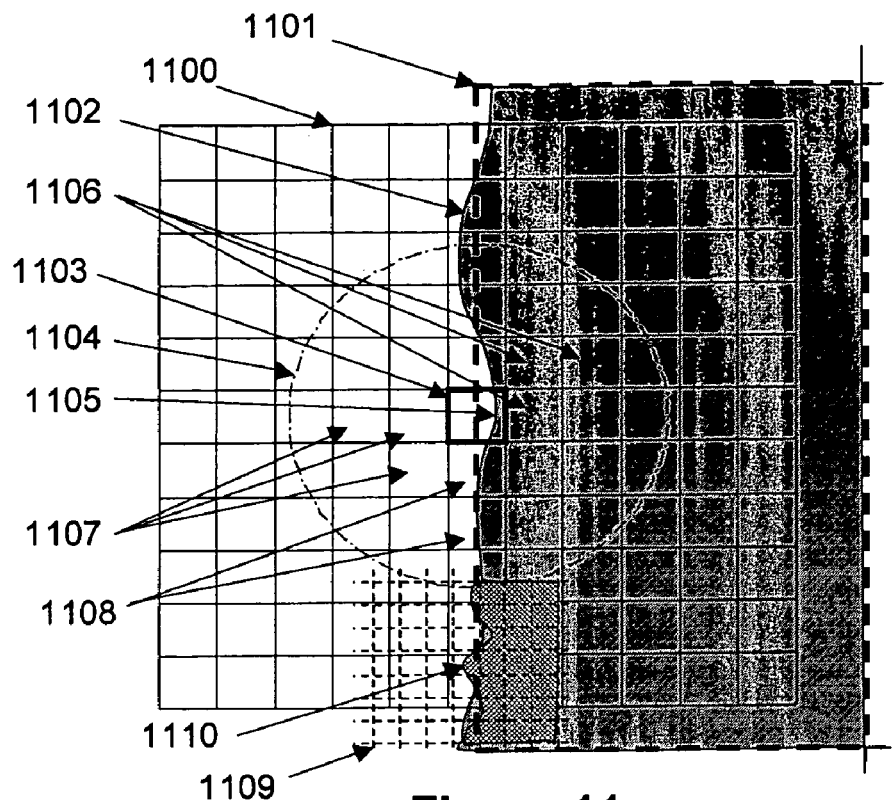
FIG. 11 depicts an imperfect edge and influence of neighboring pixels on a local edge placement.

For an ideal system with equal mirrors, the photometric calibration produces straight edges if the input data is a straight edge 1101 in FIG. 11. With real-world mirrors 1100, there are imperfections that are not completely removed by calibration. The photometric calibration methods leave a residual waviness 1102 in an edge. As straightness and correctness of edges are important printing parameters, even small improvements in edge control are valuable.

Figure 12:
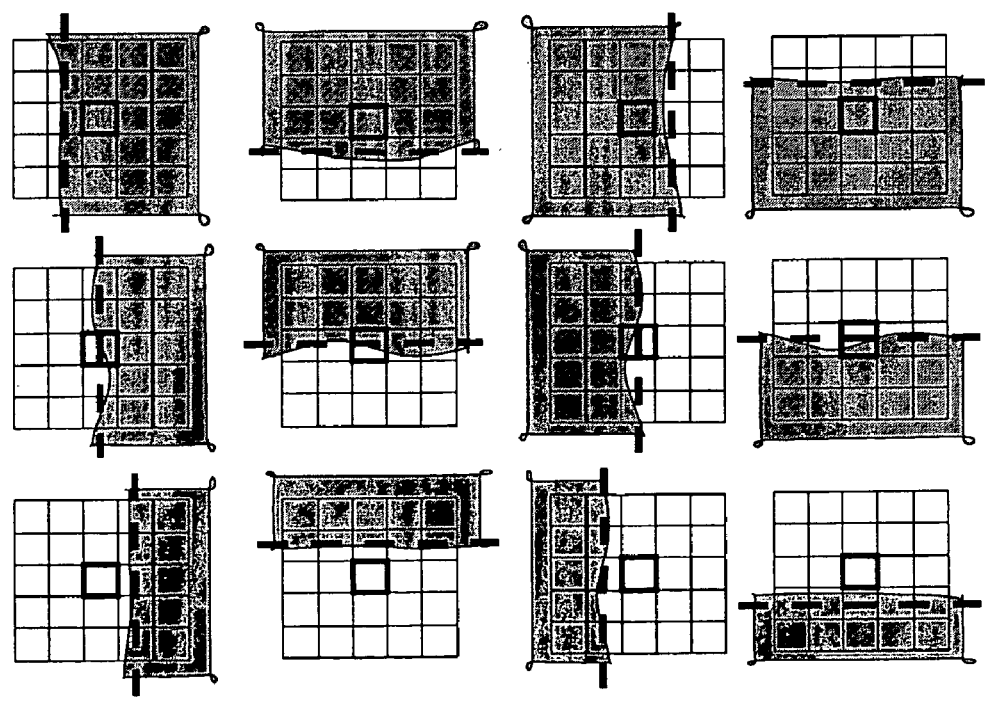
FIG. 12 illustrates varying line placements useful for calibration.

Modulators are loaded with line pattern data. An image is produced from the modulators and the line pattern image 1102 is recorded. The edges of the line are quantified for placement and straightness, and corrections to the neighboring pixels 1106, 1107, 1108 are computed based on line placement 1105 at particular positions 1104 along the edge. Corrections to a particular pixel are based line placement and straightness at and near a particular pixel, as illustrated by the line placements in FIG. 12. The correction applied may be a weighted average of several corrections corresponding to varying line placements in FIG. 12. At least one and preferably two or more points on the transfer function 806 of FIG. 8 are corrected. The method can be used iteratively, by itself, or following calibration using with another method.

The procedure is as follows: A dense line-space pattern parallel to one axis is applied to the SLM. The pitch is, in a preferred embodiment, 7 pixels, so the bright and dark areas are 3.5 and 3.5 pixels wide. FIGS. 11–14 show only one edge of the line-space pattern, for clarity. The SLM is illuminated under conditions similar to those used for writing actual patterns, and the projected radiation is tapped by a semitransparent beam sampler or splitter 912, to produce a second image 1109 at a sensor array 926. The second image is created is identical the image reaching in the exposure sensitive medium on the workpiece, but the scale may be adjusted to the resolution of the sensor array 1109 and sensor-related noise 1110 is introduced. The captured image, integrated to reduce camera noise and optical speckle, is stored in an attached computer for analysis.

Before images are captured, the sensor array should be is photometrically and geometrically calibrated. The geometrical calibration may include outputting a sparse dot-pattern to the SLM and calculating an image distortion map. The photometric calibration may be done with uniform illumination. At the same time, other errors such as dark current in the sensor array can be measured and tabulated.

Figure 13:
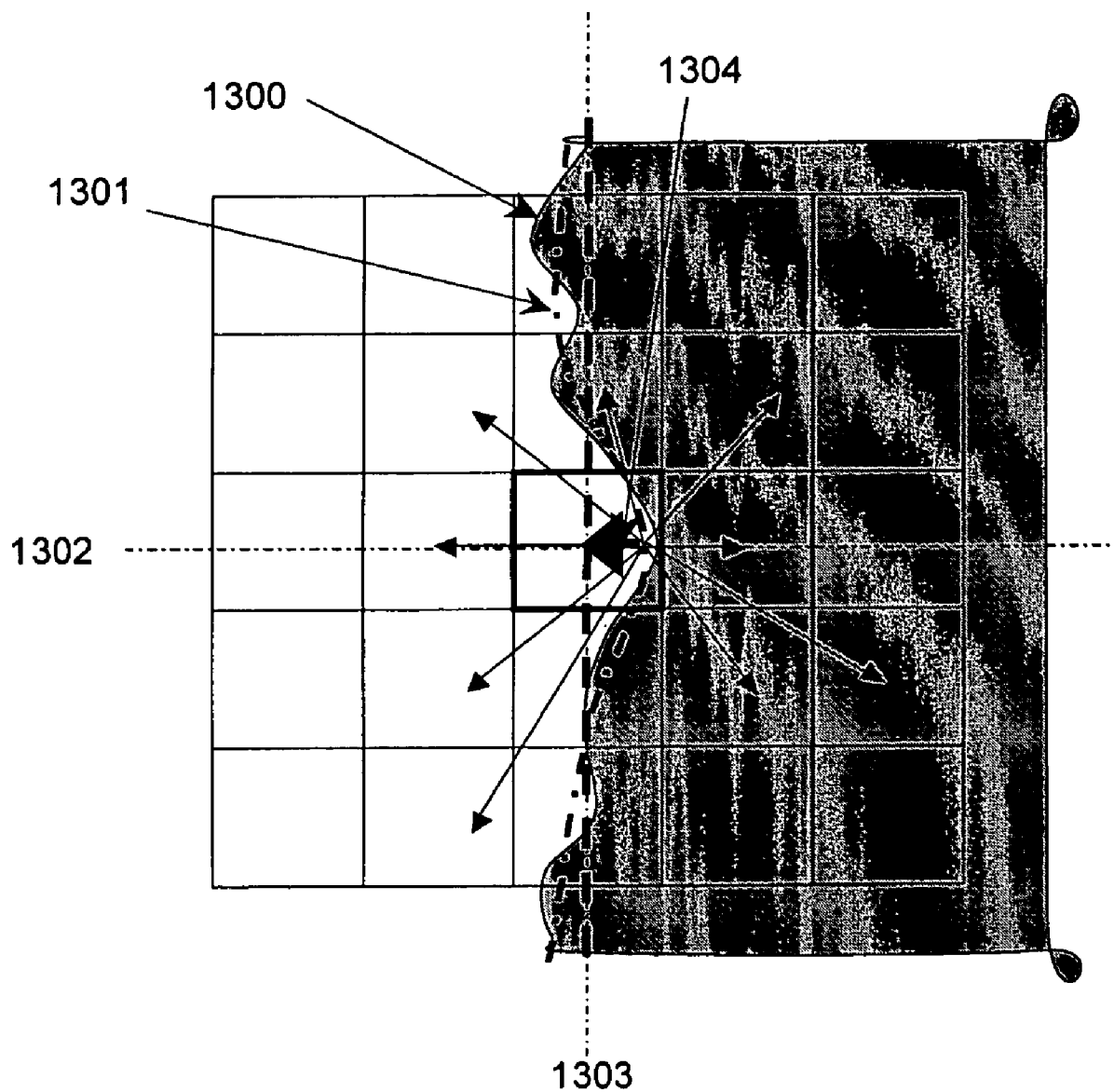
FIGS. 13 and 14 depict aspects of calibration.

An image captured by the sensor array may be corrected for geometry and sensitivity using the stored calibration data. The captured image is analyzed for edges. The edge location 1105 in the central pixel 1103 is affected by all mirrors within a radius such as 1104. (The radius illustrated is approximate and various radii can be determined to match various intensityRMS factors.) Bright neighboring pixels 1107 influence a pixel 1104 with their min-tilt. Dark pixels 1105 influence with their max-tilt. Gray pixels 1108 influence with their mid-tilt. The edge 1101 is, in principle, found by thresholding to a pre-determined level. In practice, one can numerically find a best-fitting line-edge with a spatial frequency that is compatible with the optical resolution 1301, i.e. irregularities from the camera pixels 1110 and other random sources 1300 are suppressed. The position error 1304 of the edge is calculated along the edge. Corrections are calculated for the neighboring pixels as shown in FIG. 13 and accumulated for calculation of the neighboring pixels' corrections. The correction at a location is spread over the neighboring pixels according to a weighting function.

The pixel immediately at the error vector 1304 gets the largest contribution to its correction value; nearest neighbors get a smaller one; second neighbors get only small ones. The weight functions can be predetermined, but also may be determined or refined empirically during calibration. Changing the voltage on one mirror at a time in a small neighborhood and recording the movement of the edge gives not only the relative sensitivities but also the actual numerical values, e.g. expressed in nm per DAC values. The correction value may be expressed in DAC values and scaled so that when the procedure is finished the accumulated correction value is the desired correction in DAC values.

Figure 14:
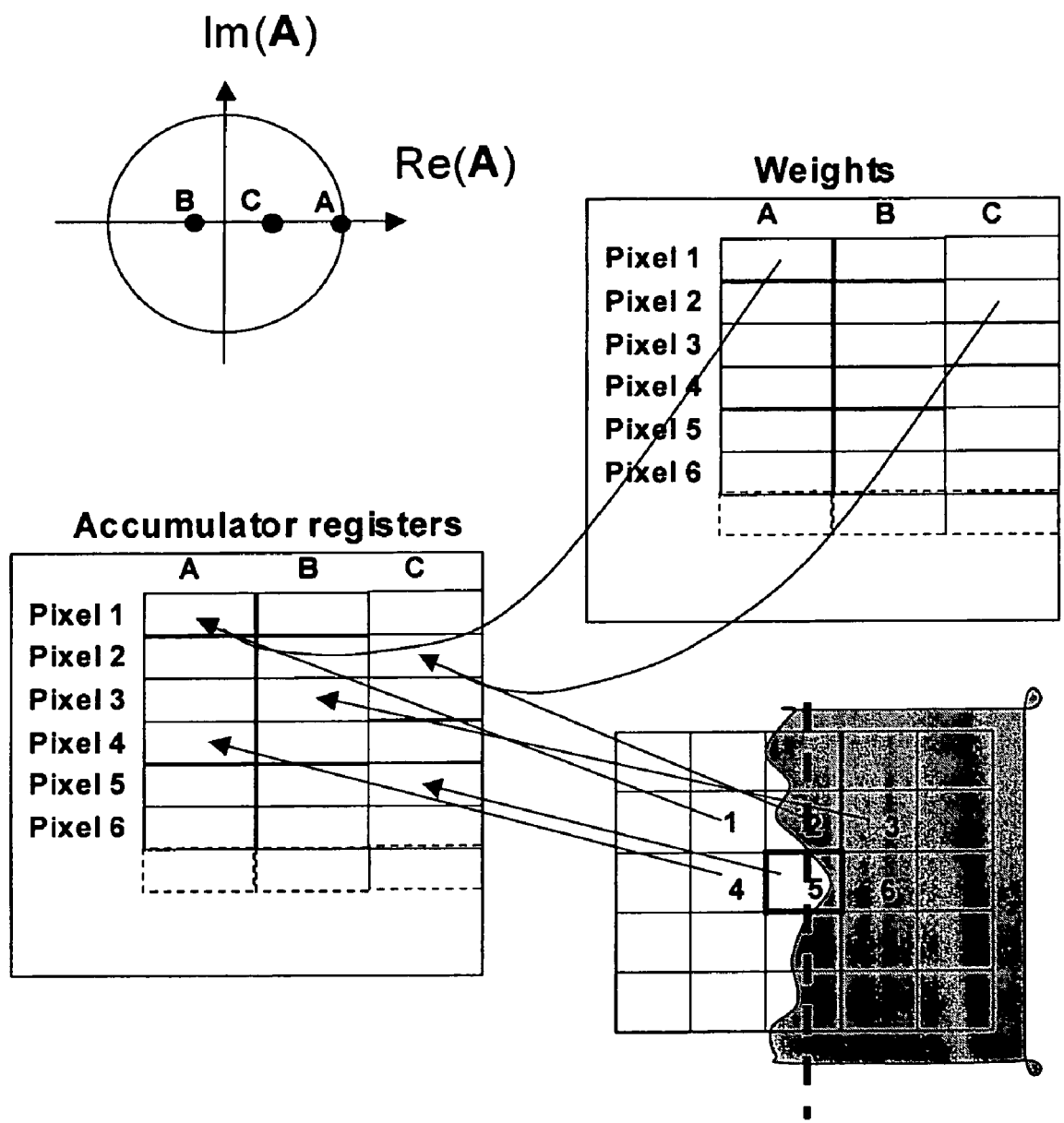

More than one correction value can be assigned to a pixel. For instance, correction values can be computed for relative amplitudes of +1, +0.4 and −0.1, as illustrated in FIG. 14. In FIG. 14, mirrors have three correction values, implemented by accumulators. With the edge placement shown in the lower right illustration, the edge position of pixel 5 is affected by the white value of pixels 1 and 4, the middle values of pixels 2 and 5 and the dark values of pixels 3 and 6. Computed corrections are weighted and accumulated in the accumulator registers. As suggested by FIG. 12, the line-space pattern is shifted one-half a pixel and a new image is recorded and processed. Alternatively, the line-space pattern can be shifted by another suitable distance before a new image is recorded and processed. More points on the transfer function 806 can be calculated directly when the line-space pattern is shifted a smaller amount. When the line-space pattern is shifted 0.5 pixels at a time across a 7 pixel pitch, before recording a new image is recorded, 14 images will be a complete set all half-integer pixel positions of the pattern. The pattern can be rotated to a different orientation (e.g., from vertical to horizontal) and a new set of images (e.g., 14 images) recorded and processed. Optionally, four sets of orientations, such as horizontal, vertical and two diagonals can be recorded as well. Calibration can be adapted to the geometry being printed, so that the most important line orientations are presented in a line-space pattern with sets of images recorded and processed. After all images have been acquired and processed there is a mirror correction map with correction for white, black and medium values and the mirror tables can be corrected.

In a preferred embodiment the mirrors have been precalibrated photometrically and the new correction map is applied by shifting, scaling or stretching the voltage scale of each mirrors, depending on the number of points in the correction map. For three or more points the stretching is done by a smooth function. For three points, a second order polynomial can be fit. For more than three points, a cubic spline function going through the computed points. Optionally, the transfer function can be adjusted to correspond to a relatively flat transfer function near max-tilt. The preferred embodiment is three points as described above. More points than three, say n, leads to a smaller displacement between each image, typically $(1/(n-1))$. A wide range of displacements can be applied with no change in the principles.

Figure 15:
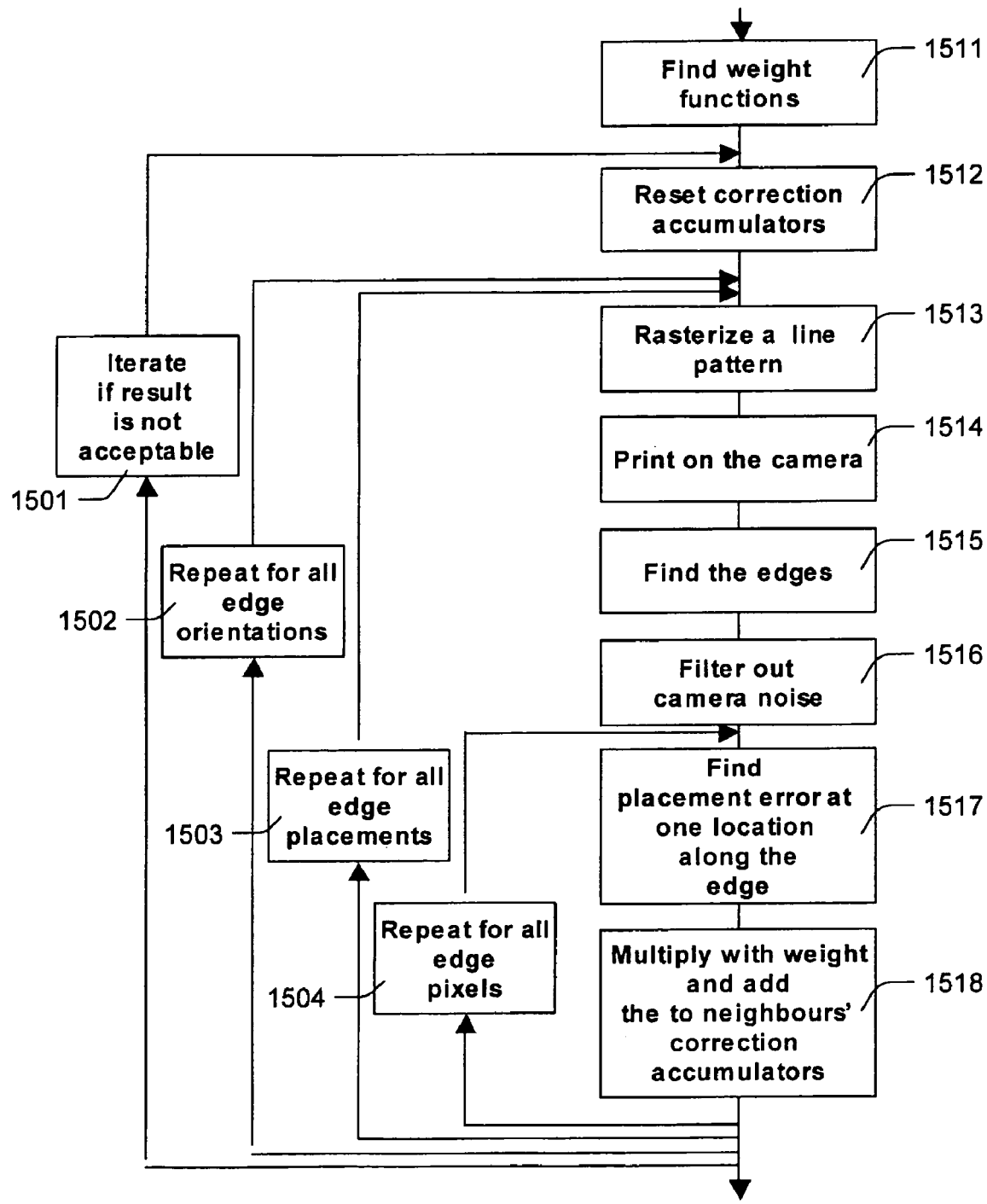
FIG. 15 is a flow chart for one calibration algorithm.

FIG. 15 is a flow diagram of the edge calibration, generally as described above and showing multiple levels of potential iteration. In this flow diagram, function weights are determined first 1511. However, as explained above, the function weights may be empirically determined at other positions in the process flow or refined during the process. A correction process begins with reset accumulators 1512. These accumulators may be reset to zero, an predetermined value, or values for individual pixels that are predetermined or iteratively determined. A line pattern is generated 1513 to be applied to the micromirror array, for instance, by rasterizing a line from vector format to rasterized format. Alternatively, calibration logic can generate lines for calibration, without rasterization, for instance by storing the simple pattern data used for calibration. An image is projected onto a sensor array 1514. The edges in the projected image are detected 1515. Camera noise is filtered out 1516, for instance by integration over time or by averaging multiple images. A placement error is determined for one location along the edge 1517. The error is distributed by a weighting function and accumulated in correction accumulators for neighboring pixels 1518. One of ordinary skill in the art will appreciate that steps 1517 and 1518 could be varied and reordered, so that multiple placement errors were determined and a single correction calculated, based on weighting of the multiple placement errors, before accessing the corresponding accumulator. Iteration proceeds of multiple levels. While the iterations across the edge orientations 1502, edge placements 1503 and edge pixels 1504 are depicted in a certain order, the order of iterations can be varied as desired. A processor system fast enough to resolve complex patterns in real time and feed them to a micromirror array is most likely to be fast enough to generate patterns in an arbitrary order of edge orientations, placements and pixels. The outer iteration loop 1501 indicates that the process can be repeated until it converges on satisfactory results. Again, while the weight functions step 1511 lies outside the iteration loop 1501, the weight function can be empirically determined during the process or refined and virtually any level of iteration.

Optionally, error diffusion can be applied to non-integer correction factors, depending on the precision with which correction factors are stored. If one mirror is allotted a correction of 0.53 DAC units and the stored precision is one DAC unit, one full unit of correction is applied, and the error $\epsilon=0.53-1.00$ can be diffused or spread among the closest neighbors. In this way, a possible source of errors and numeric noise is reduced.

The edge placement calibration can be used for any SLM and illumination scheme that produces lines. The implementation is the same whether the SLM is driven between white and zero amplitude black (e.g., A and D in FIG. 3B), or between gray and negative black (e.g., A and B in FIG. 3B). A larger dynamic range makes it more desirable to use more than three points of calibration or to predetermine curve characteristics where a point of inflection is anticipated.

An SLM used as a strongly phase-shifting mask will have a dynamic amplitude range from −1 through 0 to +1 (e.g., E, D, A in FIG. 3B.) Therefore, one point is most likely to be close to +1, another to −1, and a third near 0. As illustrated in FIG. 3E, an interface between intensity generated by negative and positive complex amplitudes will create two edges 348 in a negative resist, instead of one edge 326, 336 in a positive resist. Processing of the image needs to be changed slightly to probe two edges, instead of one. For instance, more than one mid-tilt pixel may be placed between min-tilt and max-tilt pixels, both of which are "bright" because intensity if the square of the amplitude, producing brightness from both positive and negative complex amplitudes.

The methods described above and in the claims can be used to calibrate a variety array-based pattern generators. Examples of arrays that can be calibrated are optical arrays or SLMs based on specular reflection (e.g., mirror designs taught by TI, Daewoo) grating light valves (e.g., Silicon Light Machines), LCD modulating elements, absorbing arrays (e.g., Hank Smith MIT) and on electrooptic (e.g., Xerox), photoelastic, acustooptic, magnetooptic, interferometric, or emissive (e.g., LEDs, VCSELs) properties. The light can be imaged with a single lens, multiple lenses or with lens arrays (e.g., Hank Smith MIT), refractive or diffractive. Other arrays are nearfield optical, mechanical (e.g., IBM) and electrical (e.g., carbon naontubes) writing arrays. Futhermore, it is possible to use these calibration methods for ion or electron beams based on modulator arrays such as aperture plates (e.g., SPIE 2002, Canon), photoemitters (e.g., Mapper), or multiple particle columns (e.g., ETEC, Broody). For optical writers, it is preferable to use a camera for image pickup. For particle beams devices measuring the particles, such as arrays of particles detectors, can be used. Regardless of which type of exposure energy and modulator is used, it is always an option to expose resist and inspect the exposed pattern, as an alternative to real time data collection using a sensor or camera.

For calibration, the method needs to be adapted somewhat depending on whether the image is non-interlaced or interlaced. The diffractive micromirror SLM in partially coherent light forms a contiguous, non-interlaced image. Adjacency and influence in the image reflect the state of the modulator array. Other types of array modulators, e.g., an array of nano-tubes, or the lens array optics from MIT, produce interlaced images. Adjacent pixels are formed by non-adjacent modulator elements and at different times. Interlacing somewhat complicates the calibration software, but does not change any of the principles described above. The calibration software needs to be aware of the interlace properties and add the weighted corrections to the proper correction accumulator.

Figures 16A, 16B, 16C, 17:
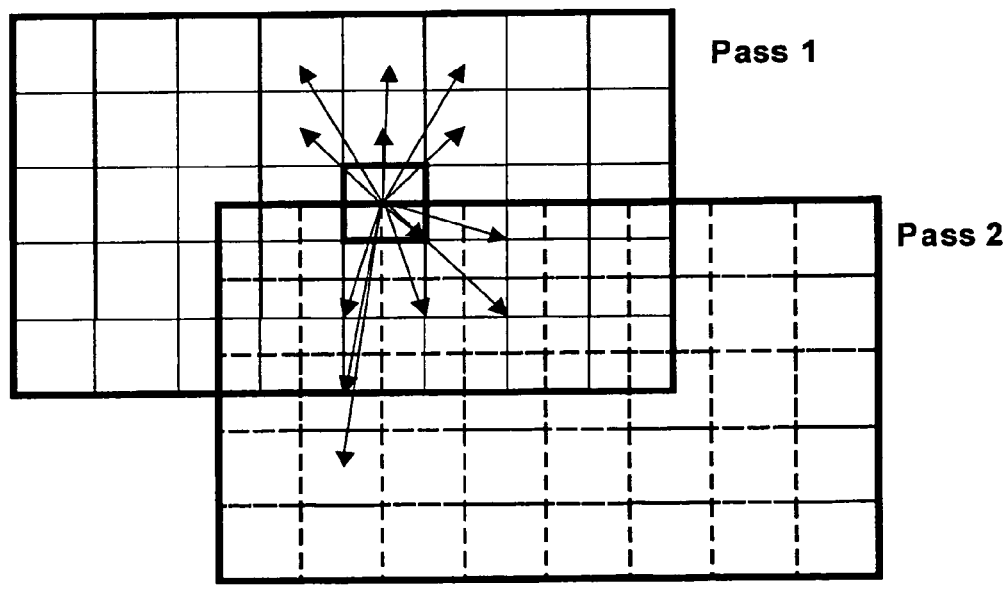

The calibration process described can be extended to multi-pass writing. The goal is to calibrate the array so that is writes without errors. In any real system, there will be error residuals. These residuals can be reduced by averaging, when a pattern is printed in multiple passes, as depicted in FIGS. 16A–16C. Two printing passes gives a reduction of random errors by the square root of two. However, since the errors can be measured and known, and offsets applied between the passes, it is possible to make a better-than-random reduction of the error residuals, as suggested by FIG. 17. The procedure can be modified so that weight-functions are determined also for the pixels being neighbors in other passes and the errors are accumulated also for those errors, as shown in FIG. 17. A simpler procedure for multipass correction, though not as effective, is to tabulate the residuals for every pixel in one pass. The resulting errors with multiple passes are then computed using the known field and pixel offsets. The full micromirror array correction table is then processed once more and the multipass residuals are corrected for pixels.

It may sound as if multipass corrections would add a large computing burden to the calibration procedure. In reality, the most compute-intensive part of the procedure is extracting the edge positions in the images. Applying the corrections based on one or multiple passes is a small difference in work, although the book-keeping is more complex with multiple passes.

From the preceding description, it will be apparent to those of skill in the art that a wide variety of systems and methods can be constructed from aspects and components of the present invention. One embodiment is a method of defining a feature boundary of exposing at least one radiation sensitive medium on a workpiece using a two-dimensional array of tilting micromirrors. Alternatively, this method can be applied to a one-dimensional array of tilting micromirrors. This method includes tilting a first set of micromirrors on one side of the boundary to produce a high reflected output and tilting a second set of micromirrors on an other side of the boundary past a tilt producing minimum reflected output intensity to till producing substantially improved contrast along the boundary. The high reflected output can be constrained by the maximum output attained by the micromirror, by a dynamic range corresponding to values attainable by various micromirrors in the array, or by a selected dynamic range chosen to enhance the ratio of positive complex amplitude produced by the first set of micromirrors to negative complex amplitude produced by the second set of micromirrors. The complex amplitude of reflected output from the second set of micromirrors may have a substantially negative value of the real component of the complex amplitude. The ratio of the absolute value of the native complex amplitude to the positive complex amplitude of a particular micromirror can be on the order of approximately 0.218, 0.5 were even 1.0, depending on the selected dynamic range for the high reflected output and the configuration of the micromirror. The desirable ratios may be greater than equal to 0.2, greater than or equal to 0.5, or approximately 1.0, depending on the application. For instance, a mask making application may use a lower ratio and a direct writing application may use a higher ratio. Substantially improved contrast along the boundary can be determined by simulation or by evaluation of latent or developed patterns in resist or another radiation sensitive medium. One aspect of this method may being selecting tilt for the first and second sets of micromirrors such the destructive interference between the sets of micromirrors substantially improved contrast. Optionally, the third set of micromirrors may be positioned between the first and second sets of micromirrors, the third set of micromirrors having an intermediate tilt. Tilting this third set of micromirrors may produce a gray scaling corresponding to a monotonic function. This monotonic function may range from the high reflected output to the output resulting from the tilt of the second set mirrors. This monotonic function may relate edge displacement in the radiation sensitive medium to tilt at the edge of the micromirrors. The monotonic function may have an inflection point closer to the tilt of the second set micromirrors than to the tilt of the first set of micromirrors, as can be deduced from the curves shown in the figures. Another aspect of this method involves how the micromirrors are tilted. They may be tilted about a substantially central axis or they may be tilted from one side. Tilting may involve deforming supporting members of the micromirrors or it may involve deforming the micromirrors themselves, as in deformable micromirror devices described by Texas Instruments.

The various aspects of the method described above may be further combined with repeatedly tilting the micromirrors, illuminating the array with a partially coherent radiation and directing the reflected output to form at least one pattern in the radiation sensitive medium and processing the workpiece to form one or more semiconductor structures on the workpiece corresponding to the pattern. When the workpiece is a reticle, the method described above may be combined with repeatedly tilting the micromirrors, illuminating the array with a partially coherent radiation and directing reflected output onto the radiation sensitive medium; developing a pattern on the reticle; and forming one or more semiconductor structures on a semiconductor substrate corresponding to the pattern.

Another embodiment is a method of defining a feature boundary when exposing a radiation sensitive medium on a workpiece using a one or two-dimensional array of tilting micromirrors. This embodiment may include tilting a first set of micromirrors on one side of the boundary to produce a high reflected output and tilting a second set of micromirrors on an other side of the boundary, past a tilt producing maximum destructive interference within reflected output of the second set of micromirrors, to a tilt producing substantial destructive interference between the reflected outputs of the first and second sets of micromirrors. A similar embodiment is a method of defining feature boundary when exposing a radiation sensitive medium on a workpiece using a one or two-dimensional array of tilting micromirrors. The similar embodiment includes tilting a first set of micromirrors on one side of the boundary to produce a high reflected output and tilting a second set of micromirrors on hand other side of the boundary past a tilt producing minimum reflected output intensity, to a tilt producing substantial destructive interference between the reflected output of the first and second sets of micromirrors. Substantial destructive interference in these embodiments is more than what would be caused accidentally by misalignment or miscalibration of mirrors. Substantial destructive interference may be determined by simulation or by evaluating patterns produced in radiation sensitive medium. The various aspects and further combinations of the first embodiment may be combined with either of these two embodiments.

Several device embodiments correspond to the methods and variations on methods described above. One device embodiment is a controller for a one or two-dimensional array of tilting micromirrors defining a feature boundary when exposing a radiation sensitive medium on a workpiece. The controller includes logic and resources operably coupled to the array adapted to drive a first set of micromirrors on one side of the boundary to a first tilt and produce a high reflected output and to drive a second set of micromirrors on an other side of the boundary to second tilt, past point of producing minimum reflected output intensity, to a point of producing substantially improved contrast along the boundary. Variations on the tilt of the second set of micromirrors in this embodiment may parallel the variations among the methods above. The tilting micromirror of this embodiment, coupled to and controlled by the controller, may include a reflecting surface footprint that has one or more of the following characteristics: a substantially central tilting axis; similar reflecting areas on opposing sides of the tilting axis; and substantially less (or more) reflecting area away from the tilting axis than at or near the tilting axis. The preceding controller embodiments may further include pattern generator components. The pattern generator components may include an illumination source, projecting radiation on the array. Optics, relaying the radiation reflected from the array to the radiation sensitive medium on the workpiece. And, a stage, supporting the workpiece, controlled to move it has feature batteries are defined. Alternatively, with or without the pattern generator components, the device may be further adapted to drive a third set of micromirrors, between the first and second sets of micromirrors, to an intermediate tilt. This intermediate tilt may be determined by a transfer function that is monotonic. The range of the monotonic function may include the tilt producing a high reflected output and a tilt producing substantially improved contrast. The monotonic transfer function may have an inflection point closer to the tilt producing substantially improved contrast than to the tilt producing a high reflected output.

An article of manufacturer embodiment includes a machine-readable medium impressed with instructions to control defining a feature boundary when exposing a radiation sensitive medium on a workpiece with a micromirror array, including instructions to implement any of the methods and variations on methods described above.

The present invention further includes several embodiments of the tilting micromirror. One tilting micromirror embodiment, adapted to be used or actually used in a micromirror array, includes a reflecting surface footprint. This reflecting surface footprint has a substantially central tilting axis, similar reflecting areas on opposing signs of the tilting axis and substantially less (or more) reflecting area away from the tilting axis than at or near the tilting axis. The similar reflecting areas may be symmetrical across the tilting axis (e.g., mirror images) or they may be symmetrical across a point on the tilting access (e.g., an image reflected twice across perpendicular axes.)

Another embodiment is a reflecting surface of a tilting micromirror adapted to be used or actually used in a micromirror array. The reflecting surface includes a reflecting surface footprint that has a substantially central tilting axis, similar reflecting areas on opposing signs of the tilting axis and substantially less (or more) reflecting area away from the tilting axis than at or near the tilting axis. In this embodiment, the reflecting surface as a range of tilt the includes a first tilt angle that produces a high reflected output and a second tilt angle, beyond a tilt producing minimum reflected output intensity to a tilt producing substantially improved contrast between micromirrors assuming the first and second tilt angles. The range of tilt angles in this embodiment may alternatively be as expressed in methods described above.

A further embodiment also includes a reflecting surface of the tilting micromirror adapted to be used or actually used in a micromirror array. The reflecting surface has a footprint that has a substantially central tilting axis and similar reflecting areas on opposing sides of the tilting axis. The reflecting surface footprint further has phase interference structures on opposing signs of the tilting axis, positioned such that the reflecting surface produces less (or more) reflected output intensity away from the tilting axis than an or near the tilting axis. One aspect of this embodiment may be that the reflecting surface footprint includes opposing edges on opposite sides of the central tilting access and that phase interference structures are positioned closer to the opposing edges and to the tilting axis. Another aspect of this embodiment may be that the reflecting surface footprint includes opposing edges at opposite ends of the central tilting axis and the interference structures are positioned closer to the opposing edges than to a point midway between the opposing edges. Yet another aspect of this embodiment may be that the interference structures are positioned along outer edges of the reflecting surface footprint. Interference structures positioned along the outer edges may effectively reduce the size of the projected intensity distribution of the micromirror. In connection with any of these embodiments for a reflecting surface of the tilting micromirror, the phase interference structures may differ in height from the reflecting surface itself by an odd multiple of a quarter wavelength.

A further embodiment is a method calibrating a two-dimensional array of micromirrors. The method preferably operates parallel to both the first and second access, but could be operated only along one axis. This method includes, parallel to a first axis, generating at least one first line of contrast between bright and dark micromirrors. The first line of contrast is applied across the array with gray valued micromirrors between the dark and bright micromirrors for at least some line locations. Logically, the line may be swept across the array. However, pattern generating logic may position the first line at various locations across the array in an arbitrary order. At various first line locations, the reflected output intensity corresponding to the micromirrors is recorded. Preferably, the process of generating a first line of contrast is repeated for a second line of contrast parallel to a section axis that is not parallel to the first axis. Logically, the first axis might run through the centers of micrometers in the second access also might run through centers of micromirrors. If the micromirrors are arranged in a Cartesian array, the axes are likely to be perpendicular. However, other orientations of axes may be applied. The optionally, the process of generating lines of contrast may be repeated for third and fourth axes that run diagonally. This method further includes calculating corrections to individual micromirrors corresponding to the recorded reflected output intensities. One aspect of this embodiment is that the first and second lines of contrast between bright and dark micromirrors have a with including at least three consecutive dark micromirrors that are either adjacent to, or separated by at least one gray micromirrors from, at least three consecutive bright micromirrors. In application this method, applying the lines of contrast may include locating lines of contrast so that at least three recording the reflected output intensity from a pixel are made corresponding to each line of contrast.

Another embodiment is method for calibrating for a two-dimensional array of micromirrors illuminated by a partially coherent source of electromagnetic radiation having a characteristic wavelength. This method includes generating a checkerboard pattern of micromirrors in the array, with alternating squares the checkerboard set to bright and non-bright values. The squares the checkerboard may be individual pixels or small clusters of pixels, such as two by two or three by three pixels. The method further includes driving the non-bright micromirrors in a range between a quarter-and half-wavelength difference between a tilting access and edges of the micromirrors and recording the intensity of output an image claim. It also includes determining one or more driving values or the non-bright micromirrors to use in setting a response curve the maps the driving values two the recorded output intensity. The recorded output intensity is a proxy for edge displacement. In aspect of this embodiment is setting the dark and the dynamic range of output intensity for the array based on the determined driving values.

Another embodiment is method of calibrating a two-dimensional array of micromirrors illuminated by a partially coherent source electromagnetic radiation. This method includes generating a pattern of micromirrors in the array. Most of the micromirrors are set to a first output intensity. Other micromirrors are very through a range of output intensity values. The other micromirrors are substantially separated from one another. The method includes driving the other micromirrors to range of output intensity values and recording output intensity of the other micromirrors at various drive signals. Then, determining drive signals for individual micromirrors to produce desired output intensity levels. The drive signals may be embodied in a calibration curve or transfer function. One aspect of this embodiment is that the separation among the other micromirrors may be at least three micromirrors of the first output intensity value. Alternatively, the separation between micromirrors centers, measured in the image plane, may be a factor of the root mean square of the intensity distribution corresponding to a typical bright micromirrors. As explained above, the separation between the centers of the micromirrors may be measured in me image plane. The factor may be two, three or four times through mean square of the intensity distribution.

A further embodiment is method calibrating a two-dimensional array of exposing radiation sources. This method includes generating a pattern of sources in the array, with most of the sources set to a first output intensity value and other sources. To a range of output intensity value. The other sources are sufficiently separated from one another to be individually resolved by a sensor. The method includes driving other the other sources throw a range of output intensity values and recording output intensity of the other sources at various drive signals. Drive signals are determined for the sources to produce desired output intensity levels. A further aspect of this invention is the drive signals may be determined for individual sources.

The present invention further includes logic and resources to implement any of the methods described above. It extends to a pattern generator including such logic and resources. It also includes as an article of manufacturer a memory impressed with digital logic to implement any of the methods described above. It extends to a pattern generator into which the digital logic from the article of manufacturer is loaded.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

I claim:

1. A method of calibrating a two dimensional array of micromirrors, including:
    parallel to a first axis, generating at least one first line of contrast between bright and dark micromirrors, applying the first line of contrast across the array with gray valued micromirrors between the dark and bright micromirrors for at least some first line locations, and recording reflected output intensity corresponding to the micromirrors;
    parallel to a second axis that is not parallel to the first axis, generating at least one second line of contrast between bright and dark micromirrors, applying the second line of contrast across the array with gray valued micromirrors between the dark and bright micromirrors for at least some second line locations, and recording reflected output intensity corresponding to the micromirrors; and
    calculating corrections to individual micromirrors corresponding to the recorded reflected output intensities.

2. The method of claim 1, wherein the first and second lines of contrast between bright and dark micromirrors have a width including at least three consecutive dark micromirrors that are adjacent to or separated by at least one gray micromirror from at least three consecutive bright micromirrors.

3. The method of claim 1, wherein applying the lines of contrast across the array includes locating the lines of contrast so that at least three recordings of reflected output intensity from a pixel are made corresponding to each line of contrast.

4. A method of calibrating a two dimensional array of micromirrors illuminated by a partially coherent source of electromagnetic radiation having a characteristic wavelength, including:
    generating a checkerboard pattern of micromirrors in the array, with alternating squares of the checkerboard set to bright and non-bright values;
    driving the non-bright micromirrors in a range between a quarter- and half-wavelength difference between a tilting axis and edges of the micromirrors and recording the intensity of output in an image plane; and
    determining one or more driving values for the non-bright micromirrors to use in setting a response curve that maps the driving values to the recorded output intensity.

5. The method of claim 4, further including setting the dark end of a dynamic range of output intensity for the array based on the determined driving values.

6. A method of calibrating a two dimensional array of micromirrors illuminated by a partially coherent source of electromagnetic radiation, including:
    generating a pattern of micromirrors in the array, with most micromirrors set to a first output intensity value and other micromirrors varied through a range of output intensity values, the other micromirrors being substantially separated from one another;
    driving the other micromirrors through a range output intensity values and recording output intensity of the other micromirrors at various drive signals;
    determining drive signals for individual micromirrors to produce desired output intensity levels.

7. The method of claim 6, wherein the separation among the other micromirrors is at least three micromirrors of the first output intensity value.

8. The method of claim 6, wherein the separation between centers of the other micromirrors is at least 2*intensityRMS, where intensityRMS is the root mean square of the intensity distribution corresponding to a typical bright micromirror.

9. The method of claim 6, wherein the separation between centers of the other micromirrors is at least 3*intensityRMS, where intensityRMS is the root mean square of the intensity distribution corresponding to a typical bright micromirror.

10. The method of claim 6, wherein the separation between centers of the other micromirrors is at least 4*intensityRMS, where intensityRMS is the root mean square of the intensity distribution corresponding to a typical bright micromirror.

11. The method of claim 6, wherein the other micromirrors are driven past a tilt producing minimum reflected output intensity from individual micromirrors to a tilt producing substantially improved contrast between the bright and dark micromirrors.

12. The method of claim 6, wherein the other micromirrors are driven past a tilt producing maximum destructive interference within reflected output of the other micromirrors, to a tilt producing substantial destructive interference between the reflected outputs of the micromirrors with the first output intensity values and of the other micromirrors.

13. The method of claim 6, wherein the other micromirrors are driven past a tilt producing minimum reflected output intensity from individual micromirrors to a tilt producing substantial destructive interference between the reflected outputs of the micromirrors with the first output intensity values and of the other micromirrors.

14. A method of calibrating a two dimensional array of exposing radiation sources, including:
    generating a pattern of sources in the array, with most of the sources set to a first output intensity value and other sources varied through a range of output intensity values, the other sources being sufficiently separated from one another to be individually resolved by a sensor;
    driving the other sources through a range output intensity values and recording output intensity of the other sources at various drive signals;
    determining drive signals for the sources to produce desired output intensity levels.

15. The method of claim 14, wherein the drive signals are determined for individual sources.

* * * * *

Disclaimer

7,158,280 B2 — Torbjörn Sandström, Pixbo (SE). METHODS AND SYSTEMS FOR IMPROVED BOUNDARY CONTRAST. Patent dated January 2, 2007. Disclaimer filed May 8, 2015, by the assignee, Micronic Laser Systems AB.

Hereby disclaim complete claims 1-15 of said patent.

*(Official Gazette, December 8, 2015)*